United States Patent
Mukhopadhyay et al.

(10) Patent No.: US 7,955,782 B2
(45) Date of Patent: Jun. 7, 2011

(54) BOTTOM ANTIREFLECTIVE COATINGS EXHIBITING ENHANCED WET STRIP RATES, BOTTOM ANTIREFLECTIVE COATING COMPOSITIONS FOR FORMING BOTTOM ANTIREFLECTIVE COATINGS, AND METHODS FOR FABRICATING THE SAME

(75) Inventors: Sudip Mukhopadhyay, Berkeley, CA (US); Joseph Kennedy, San Jose, CA (US); Yamini Pandey, Fremont, CA (US); Jelena Sepa, Sunnyvale, CA (US)

(73) Assignee: Honeywell International Inc., Morristown, NJ (US)

( * ) Notice: Subject to any disclaimer, the term of this patent is extended or adjusted under 35 U.S.C. 154(b) by 136 days.

(21) Appl. No.: 12/234,849

(22) Filed: Sep. 22, 2008

(65) Prior Publication Data

US 2010/0075248 A1    Mar. 25, 2010

(51) Int. Cl.
G03F 7/11    (2006.01)

(52) U.S. Cl. ............... 430/272.1; 430/271.1; 430/311; 528/30; 528/38; 528/43; 438/952

(58) Field of Classification Search .................. None
See application file for complete search history.

(56) References Cited

U.S. PATENT DOCUMENTS

| | | | |
|---|---|---|---|
| 3,884,702 A | 5/1975 | Koshimo et al. | |
| 4,299,938 A | 11/1981 | Green et al. | |
| 4,349,609 A | 9/1982 | Takeda et al. | |
| 4,413,052 A | 11/1983 | Green et al. | |
| 4,430,153 A | 2/1984 | Gleason et al. | |
| 4,476,242 A * | 10/1984 | Puskas et al. | 502/185 |
| 4,587,138 A | 5/1986 | Yau et al. | |
| 4,863,827 A | 9/1989 | Jain et al. | |
| 4,863,829 A | 9/1989 | Furuta et al. | |
| 4,910,122 A | 3/1990 | Arnold et al. | |
| 4,935,320 A | 6/1990 | Rohde et al. | |
| 4,943,511 A | 7/1990 | Lazarus et al. | |
| 4,950,583 A | 8/1990 | Brewer et al. | |

(Continued)

FOREIGN PATENT DOCUMENTS

| | | |
|---|---|---|
| EP | 0092524 A2 | 5/1983 |
| WO | 03044078 A1 | 5/2003 |
| WO | 03044600 A1 | 5/2003 |
| WO | 2005049681 A2 | 6/2005 |
| WO | 2007144452 A1 | 12/2007 |

OTHER PUBLICATIONS

Brewer, T., et al., The Reduction of Standing-Wave Effect in Positive Photoresists, Journal of Applied Photographic Engineering, vol. 7, No. 6, pp. 184-186, Dec. 1981.

(Continued)

*Primary Examiner* — Cynthia Hamilton
(74) *Attorney, Agent, or Firm* — Ingrassia Fisher & Lorenz, P.C.

(57) ABSTRACT

Bottom antireflective coating (BARC) that exhibit enhanced wet strip rates, BARC compositions for fabricating such BARCs, and methods for manufacturing such BARC compositions are provided. According to one exemplary embodiment, a bottom antireflective coating (BARC) composition comprises an inorganic-based compound, an absorbing material, and a wet strip-rate modifier combination. The wet strip-rate modifier composition comprises a combination of a short chain linear alcohol and dipropylene glycol (DPG), a combination of the short chain linear alcohol and tetraethylene glycol (TEG), a combination of DPG and TEG, or a combination of the short chain linear alcohol, DPG, and TEG.

10 Claims, 2 Drawing Sheets

U.S. PATENT DOCUMENTS

| | | | |
|---|---|---|---|
| 5,100,503 | A | 3/1992 | Allman et al. |
| 5,116,637 | A | 5/1992 | Baney et al. |
| 5,126,289 | A | 6/1992 | Ziger |
| 5,302,849 | A | 4/1994 | Cavasin |
| 5,403,680 | A | 4/1995 | Otagawa et al. |
| 5,514,394 | A * | 5/1996 | Lenahan ............... 426/120 |
| 5,759,625 | A | 6/1998 | Laubacher et al. |
| 5,851,730 | A | 12/1998 | Thackeray et al. |
| 5,851,738 | A | 12/1998 | Thackeray et al. |
| 6,165,697 | A | 12/2000 | Thackeray et al. |
| 6,268,457 | B1 | 7/2001 | Kennedy et al. |
| 6,284,675 | B1 * | 9/2001 | Jin et al. ............... 438/778 |
| 6,329,118 | B1 | 12/2001 | Hussein et al. |
| 6,365,529 | B1 | 4/2002 | Hussein et al. |
| 6,365,765 | B1 | 4/2002 | Baldwin et al. |
| 6,451,503 | B1 | 9/2002 | Thackeray et al. |
| 6,472,128 | B2 | 10/2002 | Thackeray et al. |
| 6,515,073 | B2 | 2/2003 | Sakamoto et al. |
| 6,528,235 | B2 | 3/2003 | Thackeray et al. |
| 6,730,454 | B2 | 5/2004 | Pfeiffer et al. |
| 6,824,879 | B2 | 11/2004 | Baldwin et al. |
| 7,104,982 | B2 | 9/2006 | McDaniel |
| 7,202,013 | B2 | 4/2007 | Ogihara et al. |
| 7,303,785 | B2 | 12/2007 | Ogihara et al. |
| 7,378,222 | B2 | 5/2008 | Thackeray et al. |
| 2004/0018346 | A1 * | 1/2004 | Jung et al. ............ 428/195.1 |
| 2004/0151670 | A1 * | 8/2004 | Blondino et al. .......... 424/45 |
| 2005/0171277 | A1 | 8/2005 | Li et al. |

OTHER PUBLICATIONS

Crivello, T., et al, Diaryliodonium Salts as Thermal Initiators, Journal of Polymer Science, vol. 21, 1-15, 97-109, Jan. 1983.

Degussa, Silanes for Adhesives and Sealants, Dynaslyan, pp. 18, 19, 23-24, Sep. 2006.

Hawley's Condensed Chemical Dictionary 11th Ed. 1987, 85-86.

HD Micro Puts out Positive Polyamide, Electronic News, Jun. 19, 2000.

Lamola, A., et al. Chemically Amplified Resists, Solid State Technology, Aug. 1991, 53-60.

Lin, Y, et al., Some Aspects of Anti-Reflective Coating for Optical Lithography, SPIE, vol. 469, Advances in Resist Technology, pp. 30-37, 1984.

McKean, D., et al., Characteristics of a Novolac-Based Three-Component Deep-UV Resist, Chem. Mater. 1990, 2, 619-624.

Nalamasu, O., et al., Development of a Chemically Amplified Positive (CAMP) Resist Material for Single Layer Deep-UV Lithography, SPIE vol. 1262, Advances in Resist Technology and Processing VII, pp. 32-41, 1990.

Silverstein, R., et al., Spectrometric Identification of Organic Compounds 5th edition—1991.

Silverstein, R., et al., Spectrometric Identification of Organic Compounds 3th edition—1974.

Brinker, C., et al., Sol-Gel Derived Antireflective coatings for Silicon, Solar Energy Materials 5 (1981) 159-172.

Jaskot, R., et al., Toxicity of an Anthraquinone Violet Dye Mixture Following Inhalation Exposure, Intratracheal Instillation, or Gavage, Fundamental and Applied Toxicology 22, 103-112 (1994).

Willson, C. G., Organic Resist Materials—Theory and Chemistry, Introduction to Microlithography, American Chemical Society, pp. 88-159, Feb. 1983.

* cited by examiner

| EXAMPLE | ETHANOL (g) | N-PROPANOL (g) | DPG (g) | TEG (g) | OTHER (g) | WSR/CLK888 (nm/min) AT 50°C | WSR/2.38% TMAH (nm/min) AT 25°C |
|---|---|---|---|---|---|---|---|
| 1 | 47 | | | | | 0.4 | 0 |
| 2 | 33 | 14 | | | | 1 | 0 |
| 3 | 33 | 14 | 2.8 | | | 1.6 | 0 |
| 4 | 33 | 14 | | 0.2 | | 3.8 | 0 |
| 5 | 47 | | 2.8 | 0.2 | | 4.8 | 0 |
| 6 | 34 | 14 | 2.8 | 0.2 | | 7.4 | 0 |
| 7 | 34 | 20 | 2.8 | 0.2 | | 7.3 | 0 |
| 8 | 34 | 28 | 2.8 | 0.2 | | 8.3 | 0 |
| 9 | 34 | 14 | 5 | 0.2 | | 7.6 | 0 |
| 10 | 34 | 14 | 5 | 0.5 | | 14.6 | 0 |
| 11 | 34 | 14 | 5 | 1.5 | | 34.6 | 0 |
| 12 | 34 | 14 | 5 | 3.5 | | 45 | 0 |
| 13 | 34 | | 2.8 | 0.2 | 14 g METHANOL | 5.1 | 0 |
| 14 | 34 | | 2.8 | 0.2 | 14 g BUTANOL | 4.1 | 0 |
| 15 | 34 | | 2.8 | 0.2 | 14 g PENTANOL | 4.4 | 0 |
| 16 | 47 | | | | 1 g OF 10 PPM PHOSPHOROUS | 0.7 | 0 |
| 17 | 47 | | | | 1 g OF 10 PPM BORON | 1.6 | 0 |
| 18 | 34 | 14 | 5 | 5.5 | | 45 | 7.2 |
| 19 | 34 | 14 | | 5.5 | | 45 | 35.2 |
| 20 | 34 | 14 | 2.8 | 0.2 | | 7.6 | 0 |
| 21 | 34 | 14 | 2.8 | 0.2 | | 7.6 | 0 |

FIG. 4

BOTTOM ANTIREFLECTIVE COATINGS EXHIBITING ENHANCED WET STRIP RATES, BOTTOM ANTIREFLECTIVE COATING COMPOSITIONS FOR FORMING BOTTOM ANTIREFLECTIVE COATINGS, AND METHODS FOR FABRICATING THE SAME

FIELD OF THE INVENTION

The present invention generally relates to antireflective coating compositions and methods for fabricating antireflective coating compositions, and more particularly relates to bottom antireflective coatings for via fill and photolithography exhibiting enhanced wet strip rates, bottom antireflective coating compositions for forming such bottom antireflective coatings, and methods for fabricating such bottom antireflective coatings and bottom antireflective coating compositions.

BACKGROUND OF THE INVENTION

The semiconductor industry is constantly driven to increase the operating speed of integrated circuit devices, e.g., microprocessors, memory devices, and the like. This drive is fueled by consumer demands for computers and electronic devices that operate at increasingly greater speeds. This demand for increased speed has resulted in a continual reduction in the size of semiconductor devices. Manufacturing of devices with smaller feature sizes introduces new challenges in many of the processes conventionally used in semiconductor fabrication. One of the most important of these fabrication processes is photolithography.

Photolithography is a commonly practiced process of creating a patterned mask on the surface of a semiconductor wafer so that subsequent patterned processes may be performed. During photolithography, a photoresist is deposited overlying a substrate and is patterned so that the pattern subsequently can be transferred to the underlying substrate by etching the substrate using the photoresist as an etch mask. Anti-reflective coatings (ARCs) are known and used to mitigate defects during the patterning of the substrate by attenuating or absorbing the light waves reflected from the substrate surface during photo exposure operations to improve image contrast. ARCs are of two types, that is, top anti-reflective coatings (TARCs) that reside overlying the photoresist and bottom anti-reflective coatings (BARCs) that are typically interposed between the substrate surface and the photoresist so as to serve as a barrier that inhibits the reflected waves from traversing back through the photoresist and adversely affecting the imaging process, which helps in defining images. Although some photoresist developer-soluble BARC materials exist, the majority of BARC materials require a plasma etch step to etch the BARC following lithographic patterning of the photoresist. Following plasma etch of the BARC, the underlying film (or films) is then etched typically through the use of a dry, plasma process.

With feature sizes continually shrinking in new device generations and with the use of porous dielectric materials to achieve low dielectric constant properties, the stripping or removal rate of the BARC from the patterned substrate is of growing importance. An improvement in the wet strip rate of BARCs used after feature patterning, that is, the rate of removal of any remaining BARC after plasma etching of the underlying substrate film(s), is necessary to preserve the post-dry etch critical dimensions as well as to minimize damage to the porous or otherwise low dielectric constant substrates if such films are present.

While various additives have been used to increase the wet strip rates of BARCs, they have proven unsatisfactory for a variety of reasons. For example, such additives may significantly increase the wet strip rates of a BARC but they must be added to the BARC in such high concentrations that, upon heating, they evaporate and create pores, voids or other defects that leave the BARC with an undesirably rough surface, which in turn introduces defects into the photolithography process. Typically, very high levels of additives that increase the BARC's wet strip rate also render it soluble in photoresist developer. Any loss of the BARC during patterning of the photoresist with photoresist developer leads to changes in the patterned critical dimensions of the photoresist or, worse, the complete loss of the photoresist features. In addition, some of the additives are added as solids to the BARC compositions used to form the BARCs, which solids prevent thin BARCs from being formed. Such additives also may prevent the BARC compositions from performing satisfactory via fill without unwanted voids. Further, such additives may adversely interfere with the adhesion properties of the BARC compositions relative to the materials upon which they are deposited, such as dielectric materials, or relative to the materials which are deposited on them, such as, other ARCs.

Accordingly, it is desirable to provide BARC compositions that result in BARCs that exhibit enhanced wet strip rates while also exhibiting resistance to photoresist developers. It also is desirable to provide BARC compositions that exhibit good adhesion properties and result in via fill with minimal voids. In addition, it is desirable to provide methods for fabricating such BARC compositions. Moreover, it is desirable to provide BARCs made from such BARC compositions. Furthermore, other desirable features and characteristics of the present invention will become apparent from the subsequent detailed description of the invention and the appended claims, taken in conjunction with the accompanying drawings and this background of the invention.

BRIEF SUMMARY OF THE INVENTION

A bottom antireflective coating (BARC) composition is provided in accordance with an exemplary embodiment. The BARC composition comprises an inorganic-based material, an absorbing material, and a wet strip-rate modifier combination. The wet strip-rate modifier combination comprises a combination of a short-chain linear alcohol and dipropylene glycol (DPG), a combination of the short-chain linear alcohol and tetraethylene glycol (TEG), a combination of DPG and TEG, or a combination of the short-chain linear alcohol, DPG, and TEG.

A method for fabricating a bottom antireflective coating (BARC) composition is provided in accordance with another exemplary embodiment. The method comprises providing components for forming an inorganic-based material and combining an absorbing material with the components for forming the inorganic-based material to form a mixture. The mixture is heated or refluxed and a wet strip-rate modifier combination is added. The wet strip-rate modifier combination comprises a short-chain linear alcohol and dipropylene glycol (DPG), the short-chain linear alcohol and tetraethylene glycol (TEG), DPG and TEG, or a combination of the short-chain linear alcohol, DPG, and TEG, wherein the step of adding is performed before, during, or after the step of heating or refluxing.

A bottom antireflective coating (BARC) is provided in accordance with a further exemplary embodiment. The BARC comprises an inorganic-based material, an absorbing material, and a short-chain linear alcohol and dipropylene glycol (DPG), the short-chain linear alcohol and tetraethylene glycol (TEG), DPG and TEG, or the short-chain linear alcohol, DPG, and TEG.

A method for forming a bottom antireflective coating (BARC) on a substrate is provided in accordance with another exemplary embodiment. The method comprises applying a BARC composition overlying the substrate. The BARC composition comprises an inorganic-based material, an absorbing material, and a wet strip-rate modifier combination. The wet strip-rate modifier combination comprises a short-chain linear alcohol and dipropylene glycol (DPG), the short-chain linear alcohol and tetraethylene glycol (TEG), DPG and TEG, or a combination of the short-chain linear alcohol, DPG, and TEG. The substrate is baked.

BRIEF DESCRIPTION OF THE DRAWINGS

The present invention will hereinafter be described in conjunction with the following drawing figures, wherein like numerals denote like elements.

FIG. 4 is a table of the wet strip rates of BARCs formed from BARC compositions having varying wet strip-rate modifier combinations.

DETAILED DESCRIPTION OF THE INVENTION

Figure 1:
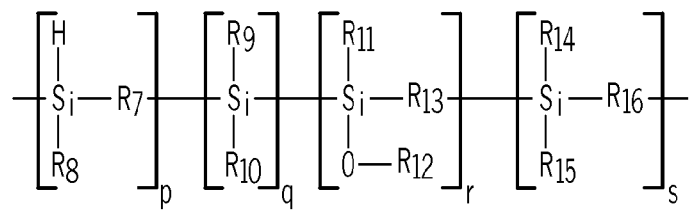
FIG. 1 illustrates a formula for a polycarbosilane.

The following detailed description of the invention is merely exemplary in nature and is not intended to limit the invention or the application and uses of the invention. Furthermore, there is no intention to be bound by any theory presented in the preceding background of the invention or the following detailed description of the invention.

Bottom antireflective coating (BARC) compositions for forming BARCs exhibiting enhanced wet strip rates are described herein. The BARC compositions may be used for a variety of applications including, but not limited to, via fill, photolithography, and for planarization layers. The BARC compositions comprise an inorganic-based compound or material, an absorbing material, and a wet strip-rate modifier combination. The wet strip-rate modifier combination enhances the wet strip rate of resulting BARCs formed from the BARC compositions while maintaining the resistance of the BARCs to conventional photoresist developers.

The wet strip-rate modifier combination does not adversely affect the structure of the resulting BARC and, thus, permits the BARCs to be formed with "planarized" surfaces. Planarization of a BARC can be determined locally, semi-globally, and globally. Local planarity is simply defined as the planarity of a local topography, while global planarity is defined as planarity across an entire device or across an entire wafer. Semi-global planarity is defined as planarity of an area less than an entire device but greater than a mere local topography. BARCs can be planarized at the global level only through the use of chemical mechanical polishing. However, if formulated in accordance with the disclosed embodiments, and if having a thickness sufficient to completely fill a local topography, the various embodiments of the BARCs of the present invention can be planar at the local level and even to some limited extent at the semi-global level. The inorganic BARC compositions comprise any compatible solvent that permits achieving a required thickness, which thickness is dictated by topography, desired planarity, and reflectivity requirements at the wavelength of an exposing radiation. In addition, the resulting BARCs have superior via fill with minimal voids within vias and good adhesion with adjacent dielectric materials within which the vias are formed. Further, the resulting BARCs demonstrate superior compatibility with additional ARCs formed thereon.

Inorganic-Based Materials and Inorganic Compounds

As described above, contemplated BARC compositions comprise at least one inorganic-based compound or material (hereinafter referred to collectively as "inorganic-based material") and preferably a spin-on inorganic-based material. As used herein, the phrases "spin-on material", "spin-on composition" and "spin-on inorganic composition" may be used interchangeably and refer to those solutions and compositions that can be spun-on to a substrate or surface. It is further contemplated that the phrase "spin-on-glass materials" refers to a subset of "spin-on inorganic materials" in that spin-on glass materials refer to those spin-on materials that comprise silicon-based compounds and/or polymers in whole or in part. It should be understood however that these contemplated inorganic materials may be applied to a surface by any suitable method or apparatus, including spin-on deposition, vapor deposition, chemical vapor deposition, and the like.

Inorganic-based materials and/or contemplated spin-on inorganic-based materials, such as silicon-based, gallium-based, germanium-based, arsenic-based, boron-based compounds, or combinations thereof are contemplated herein. Examples of silicon-based compounds comprise alkylsiloxanes, alkylsilsesquioxanes, arylsiloxanes, arylsilsesquioxanes, alkenylsiloxanes, alkenylsilsesquioxanes, and mixtures thereof. Some specific examples include, but are not limited to, methylsiloxane, methylsilsesquioxane, phenylsiloxane, phenylsilsesquioxane, methylphenylsiloxane, methylphenylsilsesquioxane, vinylsiloxane, vinylphenylsiloxanes, silazane, dimethylsiloxane, diphenylsiloxane, silicates, silsilic acid derivatives, and mixtures thereof. A contemplated silazane polymer is perhydrosilazane.

As used herein, inorganic-based materials and spin-on inorganic materials also include siloxane polymers and block polymers, hydrogensiloxane polymers of the general formula $(H_{0-1.0}SiO_{1.5-2.0})_x$ and hydrogensilsesquioxane polymers, which have the formula $(HSiO_{1.5})_x$, where x is greater than about four, and derivatives of silsilic acid. Also included are copolymers of hydrogensilsesquioxane and an alkoxyhydridosiloxane or hydroxyhydridosiloxane. Materials contemplated herein additionally include organosiloxane polymers, acrylic siloxane polymers, silsesquioxane-based polymers, derivatives of silici acid, organohydridosiloxane polymers of the general formula $(H_{0-1.0}SiO_{1.5-2.0})_n(R_{0-1.0}SiO_{1.5-2.0})_m$ and organohydridosilsesquioxane polymers of the general formula $(HSiO_{1.5})_n(RSiO_{1.5})_m$, where m is greater than zero and the sum of n and m is greater than about four and R is alkyl or aryl. Some useful organohydridosiloxane polymers have the sum of n and m from about four to about 5000 where R is a $C_1$-$C_{20}$ alkyl group or a $C_6$-$C_{12}$ aryl group. Some specific examples include alkylhydridosiloxanes, such as methylhydridosiloxanes, ethylhydridosiloxanes, propylhydridosiloxanes, and t-butylhydridosiloxanes, arylhydridosiloxanes such as phenylhydridosiloxanes; alkenylhydridosiloxanes, such as vinylhydridosiloxane; alkylhydridosilsesquioxanes, such as methylhydridosilsesquioxanes, ethylhydridosilsesquioxanes, propylhydridosilsesquioxanes, and t-butylhydridosilsequioxanes; arylhydridosilsesquioxanes, such as phenylhydridosilsesquioxanes; alkenylhydridosilsesquioxanes such as vinylhydridosilsesquioxane, and combinations thereof.

In some contemplated embodiments, specific organohydridosiloxane resins utilized herein have the following general formulas:

| | |
|---|---|
| $[H—Si_{1.5}]_n[R—SiO_{1.5}]_m$ | Formula (1) |
| $[H_{0.5}—Si_{1.5-1.8}]_n[R_{0.5-1.0}—SiO_{1.5-1.8}]_m$ | Formula (2) |
| $[H_{0-1.0}—Si_{1.5}]_n[R—SiO_{1.5}]_m$ | Formula (3) |
| $[H—Si_{1.5}]_x[R—SiO_{1.5}]_y[SiO_2]_z$ | Formula (4), | wherein the sum of n and m, or the sum of x, y and z is from about 8 to about 5000, and m or y is selected such that carbon-containing constituents are present in either an amount of less than about 40 percent (Low Organic Content=LOSP) or in an amount greater than about 40 percent (High Organic Content=HOSP); R is selected from substituted and unsubstituted, normal and branched alkyls (methyl, ethyl, butyl, propyl, pentyl), alkenyl groups (vinyl, allyl, isopropenyl), cycloalkyls, cycloalkenyl groups, aryls (phenyl groups, benzyl groups, naphthalenyl groups, anthracenyl groups and phenanthrenyl groups), and mixtures thereof, and wherein the specific mole percent of carbon-containing substituents is a function of the ratio of the amounts of starting materials. In some LOSP embodiments, particularly favorable results are obtained with the mole percent of carbon-containing substituents being in the range of between about 15 mole percent to about 25 mole percent. In some HOSP embodiments, favorable results are obtained with the mole percent of carbon-containing substituents are in the range of between about 55 mole percent to about 75 mole percent.

Several contemplated polymers comprise a polymer backbone encompassing alternate silicon and oxygen atoms. In contrast with previously known organosiloxane resins, some of the polymers and inorganic-based compositions and materials utilized herein have essentially no hydroxyl or alkoxy groups bonded to backbone silicon atoms. Rather, each silicon atom, in addition to the aforementioned backbone oxygen atoms, is bonded only to hydrogen atoms and/or R groups as defined in Formulae 1, 2, 3 and 4. By attaching only hydrogen and/or R groups directly to backbone silicon atoms in the polymer, unwanted chain lengthening and cross-linking is avoided. And given, among other things, that unwanted chain lengthening and cross-linking is avoided in the resins of the present invention, the shelf life of these resin solutions is enhanced as compared to previously known organosiloxane resins. Furthermore, since silicon-carbon bonds are less reactive than silicon hydrogen bonds, the shelf life of the organohydridosiloxane resin solutions described herein is enhanced as compared to previously known hydridosiloxane resins.

In some contemplated embodiments, the polymer backbone conformation is a cage configuration. Accordingly, there are only very low levels of reactive terminal moieties in the polymer resin given the cage conformation. A cage conformation of the polymer backbone also ensures that no unwanted chain lengthening polymerization will occur in solution, resulting in an extended shelf life. Each silicon atom of the polymer is bonded to at least three oxygen atoms. Moieties bonded to the polymer backbone include hydrogen and the organic groups described herein. As used herein, the term "backbone" refers to a contiguous chain of atoms or moieties forming a polymeric strand that are covalently bound such that removal of any of the atoms or moiety would result in interruption of the chain.

In some contemplated embodiments, the molecular weight of the inorganic-based material may be changed in order to change the solubility of the material or its ability to form a planarized surface. In turn, changing the solubility of the material helps to prevent voiding and film defects, maintains overall material performance, and increases the shelf life of the material.

Absorbing Materials

As mentioned earlier, contemplated BARC compositions comprise at least one absorbing compound and/or material (hereinafter referred to collectively as "absorbing material") that absorbs light at wavelengths of or about 248 nm, 193 nm, 157 nm or other ultraviolet wavelengths, such as 365 nm. Many naphthalene-, phenanthrene- and anthracene-based compounds have significant absorption at 248 nm and below. Benzene-based, equivalently termed here phenyl-based, compounds have significant absorption at wavelengths shorter than 200 nm. Alkenylsiloxanes, such as, for example, vinyltriethylorthosilicate (vinylTEOS), are also contemplated herein as absorbing materials that absorb light at wavelengths less than 200 nm.

While naphthalene-, anthracene-, phenanthrene- and phenyl-based compounds are frequently referred to as dyes, the term absorbing material is used here because the absorptions of these compounds are not limited to wavelengths in the visible region of the spectrum. However, not all such absorbing materials can be incorporated into inorganic-based materials for use as anti-reflective coating materials. Preferred absorbing materials suitable for use have a definable absorption peak centered around wavelengths such as 248 nm, 193 nm, 157 nm or other ultraviolet wavelengths, such as 365 nm, that may be used in photolithography. It is contemplated that a suitable "definable absorption peak" is one that is at least 0.5 nm in width, wherein width is calculated by those methods commonly known in the art of photolithography. In more preferred embodiments, the definable absorption peak is at least 1 nm in width. In even more preferred embodiments, the definable absorption peak is at least 5 nm in width. In most preferred embodiments, the definable absorption peak is at least 10 nm in width.

The chromophores of suitable absorbing materials typically have at least one benzene ring, and where there are two or more benzene rings, the rings may or may not be fused. Incorporatable absorbing materials have an accessible reactive group attached to the chromophore, wherein the reactive groups include hydroxyl groups, amine groups, carboxylic acid groups, and substituted silyl groups with silicon bonded to one, two, or three "leaving groups," such as alkoxy groups, acetoxy groups or halogen atoms. Ethoxy or methoxy groups or chlorine atoms are frequently used as leaving groups. Contemplated reactive groups comprise siliconalkoxy, silicondialkoxy and silicontrialkoxy groups, such as siliconethoxy, silicondiethoxy, silicontriethoxy, siliconmethoxy, silicondimethoxy, and silicontrimethoxy groups and halosilyl groups, such as chlorosilyl, dichlorosilyl, and trichlorosilyl groups, and acetoxy groups like methyltriacetoxysilane, and tetraacetoxysilane.

The reactive groups may be directly bonded to the chromophore, as, for example, in phenyltriethoxysilane (PTEOS), or the reactive groups may be attached to the chromophore through an ester, a ketone and/or oxygen linkage or a hydrocarbon bridge, as, for example, in 9-anthracene carboxy-alkyl trialkoxysilane. The inclusion of silicontrialkoxy groups on chromophores has been found to be advantageous, especially for promoting the stability of the absorbing silicon-on-glass (SOG) films, which results in films free of defects that would otherwise be caused by phase separation of the absorbing compounds from the inorganic-based film. Other useful absorbing compounds are those compounds that contain an azo group, —N=N—, and an accessible reactive group, particularly those containing an azo group linking benzene rings, especially when absorption around 365 nm is desired for the particular application. Azo groups may be included as part of a straight-chain molecule, a cyclic molecule or a hybrid straight-chain/cyclic molecule.

The absorbing materials may be incorporated interstitially in the inorganic-based material matrix. The absorbing materials may also be chemically bonded to the inorganic-based material or polymer. In some contemplated embodiments, the incorporatable absorbing materials form bonds with the inorganic-based material backbone or polymer backbone via the accessible reactive groups.

Absorbing materials may also comprise a silicon-based compound and an incorporatable absorbing compound that absorbs light at wavelengths less than about 375 nm. Further, it is contemplated that in other embodiments the silicon-based compound and/or the incorporatable absorbing compound comprises at least one alkyl group, alkoxy group, ketone group, acetoxy group, or azo group.

Examples of absorbing materials suitable for use include those absorbing materials that have a definable absorption peak around wavelengths less than about 375 nm, such as 365 nm, 248 nm, and 193 nm, which include compounds such as anthraflavic acid (1), 9-anthracene carboxylic acid (2), 9-anthracene methanol (3), 9-anthracene ethanol (4), 9-anthracene propanol (5), 9-anthracene butanol (6), alizarin (7), quinizarin (8), primuline (9), 2-hydroxy-4-(3-triethoxysilylpropoxy)-diphenylketone (10), 2-hydroxy-4-(3-trimethoxysilylpropoxy)-diphenylketone (11), 2-hydroxy-4-(3-tributoxysilylpropoxy)-diphenylketone (12), 2-hydroxy-4-(3-tripropoxysilylpropoxy)-diphenylketone (13), rosolic acid (14), triethoxysilylpropyl-1,8-naphthalimide (15), trimethoxysilylpropyl-1,8-naphthalimide (16), tripropoxysilylpropyl-1,8-n-aphthalimide (17), 9-anthracene carboxy-methyl triethoxysilane (18), 9-anthracene carboxyethyl triethoxysilane (19), 9-anthracene carboxy-butyl triethoxysilane (20), 9-anthracene carboxypropyl triethoxysilane (21), 9-anthracene carboxy-methyl trimethoxysilane (22), 9-anthracene carboxy-ethyl tributoxysilane (23), 9-anthracene carboxy-methyl tripropoxysilane (24), 9-anthracene carboxy-propyl trimethoxysilane (25), phenyltriethoxysilane (PTEOS) (26), phenyltrimethoxysilane (27), phenyltripropoxysilane (28), 10-phenanthrene carboxy-methyl triethoxysilane (29), 10-phenanthrene carboxy-ethyl triethoxysilane (30), 10-phenanthrene carboxy-methyl trimethoxysilane (31), 10-phenanthrene carboxy-propyl triethoxysilane (32), 4-phenylazophenol, (33), 4-ethoxyphenylazobenzene-4-carboxy-methyl triethoxysilane (34), 4-methoxyphenylazobenzene-4-carboxy-ethyl triethoxysilane (35), 4-ethoxyphenylazobenzene-4-carboxy-propyl triethoxysilane (36), 4-butoxyphenylazobenzene-4-carboxy-propyl triethoxysilane (37), 4-methoxyphenylazobenzene-4-carboxy-methyl triethoxysilane (38), 4-ethoxyphenylazobenzene-4-carboxy-methyl triethoxysilane (39), 4-methoxyphenylazobenzene-4-carboxy-ethyl triethoxysilane (40), 4-methoxyphenylazobenzene-4-carboxy-propyl triethoxysilane (41), vinyltriethoxysilane (42), and combinations, thereof. It should be appreciated, however, that this list of specific compounds is not an exhaustive list, and that contemplated compounds can be selected from the broader chemical compound classes that comprise these specific compounds. It should also be appreciated that suitable absorbing materials may be organic-based or inorganic-based materials. In some contemplated embodiments, the absorbing material may be organic-based, as long as the BARC does not share the same chemical properties with the photoresist, which can limit the useable etch process sequences.

Absorbing materials 1-25 and 29-42 are available commercially, for example, from Aldrich Chemical Company (Milwaukee, Wis.). Absorbing materials 26-28 are available commercially from Gelest, Inc. (Tullytown, Pa.). Examples of phenyl-based absorbing materials in addition to absorbing materials (26-28), many of which are also commercially available from Gelest, Inc., include structures with silicon-based reactive groups attached to phenyl rings or to substituted phenyls, such as methylphenyl, chlorophenyl, and chloromethylphenyl. Specific phenyl-based absorbing materials include phenyltrimethoxysilane, benzyltrichlorosilane, chloromethylphenyltrimethoxysilane, phenyltrifluorosilane, to name only a few examples. Diphenyl silanes including one or two "leaving groups," such as diphenylmethylethoxysilane-, diphenyldiethoxysilane, and diphenyldichlorosilane, to again name only a few examples, are also suitable incorporatable absorbing materials. Alkoxybenzoic acids may also be used as absorbing materials, including methoxybenzoic acid.

Wet Strip-Rate Modifier Combinations

As noted above, the various embodiments of the contemplated BARC compositions further comprise a wet strip-rate modifier combination that increases the wet strip rate of a resulting BARC formed from the BARC composition when subjected to an etchant. Etchants contemplated herein include, but are not limited to, Baker CLK™-888 available from Mallinckrodt Baker, Inc. of Phillipsburg, N.J., ST-250 available from ATMI of Danbury, Conn., POSH available from Honeywell International of Morristown, N.J., and dilute hydrofluoric acid (DHF). It has been observed that the wet strip rate of BARCs formed by the BARC compositions contemplated herein exhibit increased wet strip rates while maintaining resistance to photoresist developers, such as, for example, 2.35%-2.5% aqueous solutions of tetramethylammonia hydroxide (TMAH) at about 25° C. (about room temperature). This is in contrast to porogens or other prior art materials, which may increase the wet strip rate of a resulting BARC but cause the BARC to be prone to etching by a 2.35%-2.5% aqueous solution of TMAH at room temperature. In addition, the wet strip rates even further increase when subjected to stripping at higher temperatures. Further, the wet strip-rate modifier combinations contemplated herein result in BARCs exhibiting improved surface leveling capability than those without a wet strip-rate modifier combination. The wet strip-rate modifier combinations do not adversely impact either the BARCs' adhesion properties to either an underlying film or an overlying photoresist film or their via fill capabilities. Furthermore, the wet strip-rate modifier combinations show no negative effects on storage shelf life of the final BARC compositions.

In accordance with various exemplary embodiments of the present invention, the wet strip-rate modifier combination may comprise a combination of a short-chain linear alcohol and dipropylene glycol (DPG), a combination of a short-chain linear alcohol and tetraethylene glycol (TEG), a combination of DPG and TEG, or, preferably, a combination of a short-chain linear alcohol, DPG, and TEG. Examples of short chain linear alcohols suitable for use in the wet strip-rate modifier combination include ethanol, n-propanol, and a combination of ethanol and n-propanol. Without wishing to be bound by theory, it is believed that ethanol and n-propanol facilitate an increase in the wet strip rate of a resulting BARC due to a combination of the small number of carbons in each alcohol, the alcohols' abilities to solvate the inorganic material described above, and the alcohols' miscibility in water, which is typically added to and/or is a byproduct of the inorganic material synthesis.

As used herein, the term "wet strip-rate modifier combination" is not meant to imply that the components of the combination must be combined together before they are used to fabricate the BARC compositions or that the components must form selective chemical or physical bonds with each other. Rather, the term "wet strip-rate modifier combination" means that, as opposed to just one component, two, three, or four of the components n-propanol, ethanol, DPG, and TEG are used to influence the wet strip rate of the resulting BARC coating. In a preferred exemplary embodiment, the wet strip-rate modifier combination comprises from about 3 to about 40 weight percent (wt. %) of the BARC composition of n-propanol, from about 0.5 to about 50 wt. % of the BARC composition of ethanol, from about 1 to about 15 wt. % of the BARC composition of DPG, and from about 0.05 to about 10 wt. % of the BARC composition of TEG. In another, preferred, exemplary embodiment, the molecular weight of the BARC compositions comprising ethanol, n-propanol, DPG, and TEG is in the range of about 1000 to about 1100 Daltons.

The wet strip-rate modifier combination is present in the BARC composition in a concentration no greater than about 60 wt. % of the BARC composition. At this concentration range of wet strip-rate modifier combination, the wet strip rate of a resulting BARC is substantially increased, while its resistance to photoresist developers, such as, for example, TMAH solutions, is maintained and lithography characteristics are not adversely affected. At concentrations significantly greater than about 60%, the amount of the wet strip-rate modifier combination may be large enough to cause BARC film defects and introduce BARC composition stability problems and developer resistance problems. Degradation of the photoresist pattern may also result. Studies indicate that the DPG and/or TEG do not modify the structural backbone of the polymer matrix of the BARC composition. Accordingly, without being bound by theory, it is believed that, while one portion of the DPG and/or TEG vaporize when a BARC is formed on a substrate, another portion becomes partially trapped within the polymer matrix of the BARC, thereby permitting a planarized surface while also increasing the wet strip rate of the BARC when the BARC is subjected to an etchant.

In accordance with another exemplary embodiment of the invention, the wet strip-rate modifier combination further comprises a dopant, such as, for example, phosphorous or boron, or a combination thereof. The dopant is provided by a dopant donor that is added during formation of the polymer matrix of the BARC composition to obtain a polymer matrix with Si—O—X bonds that increase the wet strip rates of resulting BARCs, where X represents the dopant. Contemplated phosphorous-donating compounds for use in the BARC composition include phosphoric acid, phosphoric oxide ($P_2O_5$), and the like. Contemplated boron-donating compounds include boric acid, boron oxide ($B_2O_3$), and the like. The dopant is present in the BARC composition such that a desired etch rate is achieved without increasing the molecular weight of the BARC composition to above 1600 atomic mass units (amu). Molecular weights above 1600 amu can result in BARC film defects and via fill and planarization problems. In a preferred embodiment, the molecular weight of the BARC compositions comprising ethanol, n-propanol, DPG, TEG and a dopant is in the range of about 1200 to about 1250 Daltons. Experimental results indicate that the wet strip rate increases as the amount of dopant in the polymer matrix increases.

Material Modification Agents

The BARC compositions may also comprise one or more material modification agents. A material modification agent may include any compound or composition that can modify the BARC composition to improve the photolithographic, compatibility and/or physical quality of the resulting film or layered material, such as by improving the stability or shelf life of the composition, the adhesive properties, or by minimizing the fill bias. The material modification agent may comprise an adhesion promoter, a pH tuning agent, a high-boiling solvent, a capping layer, a cross-linking agent, a catalyst, or any other functional additive or combination thereof.

Adhesion Promoters

In some contemplated embodiments, the BARC composition further comprises an adhesion promoter. The phrase "adhesion promoter" as used herein means any component that, when used with a BARC composition, improves the adhesion of the BARC composition to substrates and/or surfaces as compared to using the target composition alone. The adhesion promoter demonstrates at least one of the following characteristics: a) is thermally stable after heat treatment, such as baking, at temperatures generally used for electronic and semiconductor component manufacture; b) has a relatively low catalytic ability in that it does not initiate significant cross-linking activity in the composition to which it is added; c) is relatively neutral so that the composition retains a low pH; d) is acidic or neutral so as not to increase the pH of the composition; e) does not initiate or propagate reactions that increase the molecular weight of species in the composition to which it is added; and f) can act as an adhesion promoter by promoting electrostatic and coulombic interactions between layers of materials, as opposed to conventionally understood Van der Waals interactions.

Adhesion to an organic resist polymer designed for low absorptivity in the UV is inherently difficult because such resists are designed with low polarity and few functional groups with which to interact adhesively. The adhesion mechanisms of silica-based formulations specifically to these organic resist polymers follow one of two pathways: a) adhesion promotion due to reduction in silanol content and increase in Van der Waals interactions and b) adhesion promotion due to an increase in the ionic contributions such as electrostatic and coulombic interaction.

It has been found that the latter mechanism is dominant, although both play a role. In a contemplated embodiment, the addition of at least one adhesion promoter, such as at least one weak acid/weak base, at least one weak acid/strong base, at least one strong acid/weak base, at least one amine base, at least one amine salt or a combination thereof increases the electrostatic and coulombic interaction. Both modeled and experimental results indicate that the salt and not the neutral (non-ionic) form of the amine enhance adhesion sufficiently with the resist to avoid collapse of lithographically defined resist lines. Examples of suitable adhesion promoters include, but are not limited to, aminopropol tetraethylorthosilicate (APTEOS) acetate, APTEOS sulfonate, APTEOS methanesulfonate, APTEOS trifluoromethanesulfonate (triflate), APTEOS tosylate, APTEOS nonafluorobutane-1-sulfonate (nfbs), tetramethylammonium hydroxide, tetramethylammonium acetate (TMAA), tetramethylammonium nitrate (TMAN), tetramethylammonium sulfate, tetramethylammonium methanesulfonate, tetramethylammonium triflate, tetramethylammonium tosylate, tetramethylammonium nfbs, tetramethylammonium triflate, ammonium nitrate, ammonium acetate, ammonium triflate, ammonium tosylate, ammonium sulfonate, ammonium methanesulfonate, or any other amine salt or combination of amine salts. Suitable amine bases comprise ammonium, pyridine, aniline, TMAH, cetyltrimethylammonium hydroxide (CTAH), tetra-n-butylammonium hydroxide (TBAH), APTEOS or a combination thereof.

In addition, enhancement of the adhesion is concentration controlled, so that any procedure that helps to concentrate the amine salt at the interface of the silica-resist will help adhesion. Such procedures include: solvation control of the salt by control of solvent; evaporation control of the solvent during spin coat or bake; addition of solubility control agents which control solubility of the salt, and addition of ammonium species to the resist.

Modeling indicates that salt mixture can be used with the same effectiveness as a single component. These mixed salt adhesion promotion schemes can be used when an increase in organic amine is required for solvent compatibility. In this case, a larger R group on the substituted ammonium center may be used, but the loss in adhesion can be compensated by addition of a more charged center such as ammonium.

Other contemplated adhesion promoters may comprise nitrogen, phosphorus or any other similarly characterized atom. Contemplated adhesion promoters may comprise a neutral or acidic compound or molecule, such as amines salts, methylammonium nitrate, tetramethylammonium acetate (TMAA), tetrabutylammonium acetate (TBAA), cetyltrimethylammonium acetate (CTAA), and tetramethylammonium nitrate (TMAN). TMAN can be obtained by either dissolving TMAN in water or by converting TMAA or TMAH to TMAN by using nitric acid. Contemplated salts comprise those salts from strong acids and primary, secondary, tertiary or tetraamines.

In some embodiments, the ratio of "mole of nitrogen/Si-compound weight (ppm)" in nitrogen containing absorbing compositions and/or coating materials is greater than about 0.01. In other embodiments, the ratio of "mole of nitrogen/Si-compound weight (ppm)" in nitrogen containing absorbing compositions and/or coating materials is greater than about 3. In yet other embodiments, the ratio of "mole of nitrogen/Si-compound weight (ppm)" in nitrogen containing absorbing compositions and/or coating materials is greater than about 4. The optimum ratio depends on an evaluation of several properties by the skilled artisan of the coating material/composition, such as the amount of organic moiety present in the material/composition, the degree of cross-linking present in the material/composition and the pH of the material/composition, thus influencing stability and shelf life; however, it should be understood that the ratio influences the lithography properties and via fill properties more so than any other previously mentioned material/composition property with respect to nitrogen-containing compositions. It should also be understood that depending on the amount of organic moiety present, the degree of cross-linking present and/or the pH of the material/composition, a suitable mole/weight ratio can be recognized and used to produce the absorbing compositions and/or coating materials contemplated herein.

Adhesion promoters contemplated herein may also comprise compounds having at least bifunctionality wherein the bifunctionality may be the same or different and at least one of the first functionality and the second functionality is selected from the group consisting of Si-containing groups; N-containing groups; C bonded to O-containing groups; hydroxyl groups; and C double bonded to C-containing groups. The phrase "compound having at least bifunctionality" as used herein means any compound having at least two functional groups capable of interacting or reacting, or forming bonds as follows. The functional groups may react in numerous ways including addition reactions, nucleophilic and electrophilic substitutions or eliminations, radical reactions, etc. Further alternative reactions may also include the formation of non-covalent bonds, such as Van der Waals, electrostatic bonds, ionic bonds, and hydrogen bonds. In some embodiments, preferably at least one of the first functionality and the second functionality is selected from Si-containing groups; N-containing groups; C bonded to O-containing groups; hydroxyl groups; and C double bonded to C-containing groups. Preferably, the Si-containing groups are selected from Si—H, Si—O, and Si—N; the N-containing groups are selected from such as C—$NH_2$ or other secondary and tertiary amines, imines, amides, and imides; the C bonded to O-containing groups are selected from =CO, carbonyl groups such as ketones and aldehydes, esters, —COOH, alkoxyls having 1 to 5 carbon atoms, ethers, glycidyl ethers; and epoxies; the hydroxyl group is phenol; and the C double bonded to C-containing groups are selected from allyl and vinyl groups. For semiconductor applications, the more preferred functional groups include the Si-containing groups; C bonded to O-containing groups; hydroxyl groups; and vinyl groups.

Contemplated adhesion promoters may also comprise an organic resin-based material that further comprises phenolic-containing resins, novolac resins, such as CRJ-406 or HRJ-11040 (both from Schenectady International, Inc.), organic acrylate and/or a styrene resins. Other adhesion promoters may comprise polydimethylsiloxane materials, ethoxy or hydroxy-containing silane monomers, vinyl-containing silane monomers, acrylated silane monomers, or silyl hydrides. An example of a contemplated adhesion promoter having Si-containing groups is silanes of the Formula I: $(R_1)_k(R_2)_l Si(R_3)_m(R_4)_n$ wherein $R_1, R_2, R_3$, and $R_4$ each independently represents hydrogen, hydroxyl, unsaturated or saturated alkyl, substituted or unsubstituted alkyl where the substituent is amino or epoxy, saturated or unsaturated alkoxyl, unsaturated or saturated carboxylic acid radical, or aryl; at least two of $R_1, R_2, R_3$, and $R_4$ represent hydrogen, hydroxyl, saturated or unsaturated alkoxyl, unsaturated alkyl, or unsaturated carboxylic acid radical; and $k+l+m+n \leq 4$. Examples include vinylsilanes such as $H_2C$=$CHSi(CH_3)_2H$ and $H_2C$=$CHSi(R_5)_3$ where $R_5$ is $CH_3O$, $C_2H_5O$, AcO, $H_2O$=CH, or $H_2C$=$C(CH_3)O$—, or vinylphenylmethylsilane; allylsilanes of the formula $H_2C$=$CHCH_2$—Si$(OC_2H_5)_3$ and $H_2C$=CHCHH$_2$—Si(H)$(OCH_3)_2$, glycidoxypropylsilanes such as (3-glycidoxypropyl)methyldiethoxysilane and (3-glycidoxypropyl)trimethoxysilane; methacryloxypropylsilanes of the formula $H_2C$=$(CH_3)COO(CH_2)_3$—Si$(OR_6)_3$ where $R_6$ is an alkyl, preferably methyl or ethyl; aminopropylsilane derivatives including $H_2N(CH_2)_3Si(OCH_2CH_3)_3$, $H_2N(CH_2)_3Si(OH)_3$, or $H_2N(CH_2)_3OC(CH_3)_2CH$=$CHSi(OCH_3)_3$. The aforementioned silanes are commercially available from Gelest.

An example of a preferred adhesion promoter having C bonded to O-containing groups is glycidyl ethers including but not limited to 1,1,1-tris-(hydroxyphenyl)ethane tri-glycidyl ether which is commercially available from TriQuest. An example of a preferred adhesion promoter having C bonded to O-containing groups is esters of unsaturated carboxylic acids containing at least one carboxylic acid group. Examples include trifunctional methacrylate ester, trifunctional acrylate ester, trimethylolpropane triacrylate, dipentaerythritol pentaacrylate, and glycidyl methacrylate. The foregoing adhesion promoters are commercially available from Sartomer.

An example of a preferred adhesion promoter having vinyl groups is vinyl cyclic pyridine oligomers or polymers wherein the cyclic group is pyridine, aromatic, or heteroaromatic. Useful examples include but not limited to 2-vinylpyridine and 4-inylpyridine, commercially available from Reilly; vinyl aromatics; and vinyl heteroaromatics including but not limited to vinyl quinoline, vinyl carbazole, vinyl imidazole, and vinyl oxazole. Vinylalkylsilanes, such as, for example, trivinylalkylsilanes, also can serve as adhesion promoters in the BARC composition.

An example of a preferred adhesion promoter having Si-containing groups is polycarbosilane having the formula shown in FIG. 1 in which $R_7$, $R_{13}$, and $R_{16}$ each independently represents substituted or unsubstituted alkylene, cycloalkylene, vinylene, allylene, or arylene; $R_8$, $R_9$, $R_{10}$, $R_{11}$, $R_{14}$, and $R_{15}$ each independently represents a hydrogen atom or an organo group comprising alkyl, alkylene, vinyl, cycloalkyl, allyl, or aryl and may be linear or branched; $R_{12}$ represents organosilicon, silanyl, siloxyl, or organo group; and p, q, r, and s satisfy the conditions of $4 \leq p+q+r+s \leq 100,000$, and q and r and s may collectively or independently be zero. The organo groups may contain up to 18 carbon atoms but generally contain from about 1 to about 10 carbon atoms. Useful alkyl groups include —$CH_2$— and —$(CH_2)_t$— where t>1. Examples of preferred polycarbosilanes include dihydrido or alkenyl substituted polycarbosilanes such as polydihydridocarbosilane, polyallylhydrididocarbosilane and random copolymers of polydihydridocarbosilane and polyallylhydridocarbosilane. Other preferred polycarbosilane compounds of the invention are polycarbosilanes in which $R_8$ and $R_{14}$ are hydrogen, $R_7$ and $R_{16}$ are methylene, and $R_{15}$ is an alkenyl, and appendent radicals q and r are zero. In the most preferred polycarbosilanes, the $R_8$ group is a hydrogen atom; $R_{11}$ is —$CH_2$—; q, r, and s are zero and p is from 5 to 25. These most preferred polycarbosilanes may be obtained from Starfire Systems, Inc.

An example of a preferred adhesion promoter having hydroxyl groups is phenol-formaldehyde resins or oligomers of the Formula II: —$[R_{20}C_6H_2(OH)(R_{21})]_u$— where $R_{20}$ is substituted or unsubstituted alkylene, cycloalkylene, vinyl, allyl, or aryl; $R_{21}$ is alkyl, alkylene, vinylene, cycloalkylene, allylene, or aryl; and u=3 to 100. Examples of useful alkyl groups include —$CH_2$— and —$(CH_2)_n$— where n>1. A particularly useful phenol-formaldehyde resin oligomer has a molecular weight of 1500 and is commercially available from Schenectady International Inc.

Another suitable adhesion promoter contemplated herein is an amine salt, such as those already disclosed herein, synthesized using at least one acid with a long tail or bulky group, such as nonafluorobutane-1-sulfonic acid (nfbs) or dodecylbenzenesulfonic acid (dbs) or an acid bonded to a silane having a reactive functional group, such as acid-tetramethylorthosilicate (acid-TEOS). These contemplated embodiments prevent acid from diffusing from the absorbing composition in the absorbing composition/photoresist layered composition to the photoresist. By preventing this diffusion of acid, adhesion is greatly improved between the two layers.

pH Tuning Agent

In accordance with another exemplary embodiment of the present invention, the BARC composition also comprises a pH tuning agent. The pH tuning agent is a compound, material or solution that is added to the BARC composition to "tune" or adjust the pH of the final material so that it is compatible or more compatible with any chosen resist material, including those with absorption peaks around 365 nm, 248 nm and 193 nm and 157 nm. It should be appreciated, however, that the pH tuning agent not only adjusts the pH of the BARC composition, but it also influences the chemical performance and characteristics, mechanical performance and structural makeup of the BARC composition and/or resulting BARC, such that the BARC is more compatible with the resist material that is coupled to it. More specifically, the pH tuning agent strongly influences the polymeric characteristics, the structural makeup and the spatial orientation that results in optimized film architecture by increasing the surface properties of the BARC for optimal resist performance. Also, it should be understood that several pH tuning agents may also be appropriate as densifying agents, catalysts or both. The pH tuning agent in many cases also may facilitate stability of the inorganic system in the dilution solvent, described in more detail below, leading to improved shelf life properties such as stability of molecular weight.

Contemplated pH tuning agents must perform two separate and sometimes related functions: a) to influence the pH of the composition to which it is being added; and b) to influence the mechanical performance, chemical properties, and/or structural makeup of the inorganic material, which can also be stated as strongly influencing the polymeric characteristics, the structural makeup and the spatial orientation that results in enhancing the surface properties of the inorganic coating for optimal performance.

Contemplated pH tuning agents are partly designed to influence the pH of the composition to which it is added. The class of potential pH tuning agents comprises a) any suitable acidic or basic solution, compound, and/or component and/or b) any suitable strength or concentration of an acidic or basic solution, compound and/or component. This compilation of suitable pH "influencers" is the larger set of compounds from which the ultimate pH tuning agent is chosen, because the pH "influencer" must also be able to influence the mechanical performance and/or structural makeup of the inorganic material while also making the BARC compatible or more compatible with coupled layers. By this, for example, it is meant that the chosen pH tuning agent is also designed to match the solubility parameter, the molecular weight, the melting point or some other physical characteristic of the material. In other words, the pH tuning agent and the BARC composition and/or BARC cannot be physically incompatible, depending on the desirable physical characteristic, even if the pH tuning agent performs its first function of influencing the pH of the mixture. In preferred embodiments, the desirable physical characteristic is the solubility parameter or the molecular weight. In more preferred embodiments, the desirable physical characteristic is the solubility parameter.

Examples of some suitable pH tuning agents comprise various molar concentrations of the class of amines, such as γ-aminoalkyltrialkoxysilanes, specifically γ-APTEOS; water; oxides and alkoxides, such as sodium alkoxides, potassium alkoxides, potassium hydroxide; hydrogen halides, such as hydrogen bromide, hydrochloric acid; acetic acid; sulfuric acid, triflic acid, lactic acid, nitric acid; TMAH; amine-based oligomers, including those oligomers with inorganic atoms such as silicon, and combinations thereof. Contemplated molar concentrations of the pH tuning agent include pure, 10 Molar (M), 1.0 M, 0.1 M, and 0.01 M concentrations, depending on the pH agent chosen for the resist material.

Additional examples of pH tuning agents include those adhesion promoters discussed above, namely tetramethylammonium acetate (TMAA), tetramethylammonium hydroxide (TMAH), tetrabutylammonium acetate (TBAA), cetyltrimethylammonium acetate (CTAA) and tetramethylammonium nitrate (TMAN).

Densifying Agent

At least one densifying agent may be added to the BARC compositions disclosed herein. The densifying agent is similar to those previously mentioned in other material modification sections. It should be understood that many of the compounds mentioned in this and other sections overlap in that some of these compounds may be densifying agents and catalysts, densifying agents and pH tuning agents, or densifying agents and adhesion promoters. The densifying agent comprises at least one compound, material or solution that is added to the BARC compositions described herein in order to "tune" or adjust the density of the final composition so that the density or other related physical characteristics of the final material are increased relative to the reference material. As used herein, the "reference material" is that material that comprises each component of the contemplated composition described herein except the densifying agent. The "reference material" is meant to be a benchmark composition to which contemplated compositions may be compared. Without being bound by theory, it is believed that densifying agents increase the crosslink density through enhancement or catalysis of the crosslinking reaction of neighboring silicon hydroxyl species.

It should be appreciated, however, that the densifying agent not only adjusts the density of the absorbing composition, but it also influences the chemical performance and characteristics, mechanical performance and structural makeup of the final composition that is part of the layered material, electronic component or semiconductor component, such that the final composition is more compatible with the resist material that is coupled to it. More specifically, the densifying agent strongly influences the polymeric characteristics, the structural makeup and the spatial orientation that results in increasing the surface properties of the underlying coating, including not only anti-reflective coatings but other layers and layered materials, for optimal resist performance.

Like other material modification agents disclosed herein, contemplated densifying agents may perform two separate and sometimes related functions: a) to influence the physical properties of the composition to which it is being added; and b) to influence the mechanical performance and/or structural makeup of the composition, which can also be stated as strongly influencing the polymeric characteristics, the structural makeup and the spatial orientation that results in increasing the surface properties of the layer, coating and/or material, such as an anti-reflective coating, for optimal resist and/or component performance.

Contemplated densifying agents are partly designed to influence the density of the composition to which it is added. The class of potential densifying agents comprises a) any suitable acidic or basic solution, compound, and/or component and/or b) any suitable strength or concentration of an acidic or basic solution, compound and/or component. This compilation of suitable density "influencers" is the larger set of compounds from which the ultimate densifying agent is chosen, because the density "influencer" must also be able to influence the mechanical performance and/or structural makeup of the final composition while also making the final absorbing composition compatible or more compatible. By this, for example, it is meant that the chosen densifying agent is also designed to match the solubility parameter, the molecular weight, the melting point or some other physical characteristic of the inorganic materials, spin-on inorganic materials and/or spin-on-glass materials. In other words, the densifying agent and the inorganic materials, spin-on inorganic materials and/or spin-on-glass materials cannot be physically incompatible, depending on the desirable physical characteristic. In preferred embodiments, the desirable physical characteristic is the solubility parameter or the molecular weight. In more preferred embodiments, the desirable physical characteristic is the solubility parameter.

Examples of some suitable densifying agents or density-tuning agents comprise various molar concentrations of the class of amines, such as γ-aminoalkyltrialkoxysilanes and nitrogen-based salts of those silane compounds, specifically γ-APTEOS and APTEOS-N; water; oxides and alkoxides, such as sodium alkoxides, potassium alkoxides, potassium hydroxide; hydrogen halides, such as hydrogen bromide, hydrochloric acid; acetic acid; sulfuric acid, triflic acid, lactic acid, nitric acid; TMAH; acetate-based compounds, such as tetra-methyl ammonium acetate (TMAA), APTEOS-acetate and ammonium acetate; nitrate-based compounds, such as tetra-methyl ammonium nitrate (TMAN—a nitric acid stabilized form of TMAA) and ammonium nitrate; amine-based oligomers, including those oligomers with inorganic atoms such as silicon, and combinations thereof. Contemplated molar concentrations of the densifying agent include pure, 10 M, 1.0 M, 0.1 M, and 0.01 M concentrations, depending on the densifying agent chosen for the resist material.

Solvents

At least one high-boiling point solvent may be added to the BARC composition. Without being bound to any particular theory, it is understood that the addition of a high-boiling point solvent prevents voiding and improves planarization by making a BARC film a "slow drying" film. As used herein, the phrase "high boiling point solvents" means that the solvent volatilizes at a temperature at, near and/or preferably slightly above the drying and/or curing temperature of the BARC composition. Preferred high boiling point solvents include glycerol, dibutylether, ethyl lactate dibutylglycerol, dimethyl sulfoxide (DMSO), dimethylformamide (DMF), N-methyl-pyrrolidone (NMP), di-methyl-acetamide (DMAc), high-boiling point aromatic-based solvents, petroleum ether, the carbitol family, the glycol ether family, TEG, and DPG. Alcohols due to their propensity to hydrogen bond to terminal Si—OH groups can fall into the class of "high-boiling point solvents" as well. Such alcohols can be short chain alcohols, such as ethanol, up to longer chain alcohols, such as n-propoxypropanol. Linear alcohols have a greater propensity to stay within the film through hydrogen bonding than branched alcohols.

Typical solvents also are those solvents that are able to solvate the monomers and polymers contemplated herein to be used as BARC compositions. Contemplated solvents include any suitable pure or mixture of organic, organometallic, or inorganic molecules that are volatilized at a desired temperature. The solvent may also comprise any suitable pure or mixture of polar and non-polar compounds. In preferred embodiments, the solvent comprises water, ethanol, propanol, acetone, toluene, ethers, cyclohexanone, butyrolactone, methylethylketone, methylisobutylketone, N-methylpyrrolidone, polyethyleneglycolmethylether, mesitylene, ethyl lactate, PGMEA, anisole, families of poly-ether solvents such as carbitols (which constitute a family of ethyleneglycol ethers capped by hydroxy, alkoxy or carboxy groups), long chain alcohols such as n-propoxypropanol, or analogous propyleneglycol ethers.

Capping Agents

At least one capping agent may also be added to the BARC composition as a material modification agent. As used herein, the term "capping agent" means a terminating monomer that effectively controls the molecular weight of a particular polymer by "capping" the end of the polymer. In contemplated embodiments, the capping agent comprises a silane monomer with only one reactive group, such as an ethoxy reactive group, with the rest of the monomer being methyl groups. Furthermore, the silane monomer is added late in the parent reaction that forms the inorganic-based material. Any suitable terminating monomer may be used in this application, including silane compositions such as TMEOS.

It will be appreciated that the BARC composition also may comprise any other functional additives. Examples of other suitable additives that may be utilized in the BARC composition include surfactants, cross-linking agents, catalysts, wetting agents, antifoaming agents, detergents and other surface-tension modifiers, viscosity modifiers, rheology modifiers, and mixtures thereof.

Methods for Fabricating BARC Compositions

In general, to produce the BARC compositions, the absorbing material, such as an absorbing material 1-42, or combinations thereof, is combined with silane reactants, such as to form the inorganic-based materials described above, during the synthesis of the BARC composition. The wet strip-rate modifier combination may also be combined with the silane reactants during the synthesis of the inorganic-based material or once the synthesis is complete.

Figure 2:
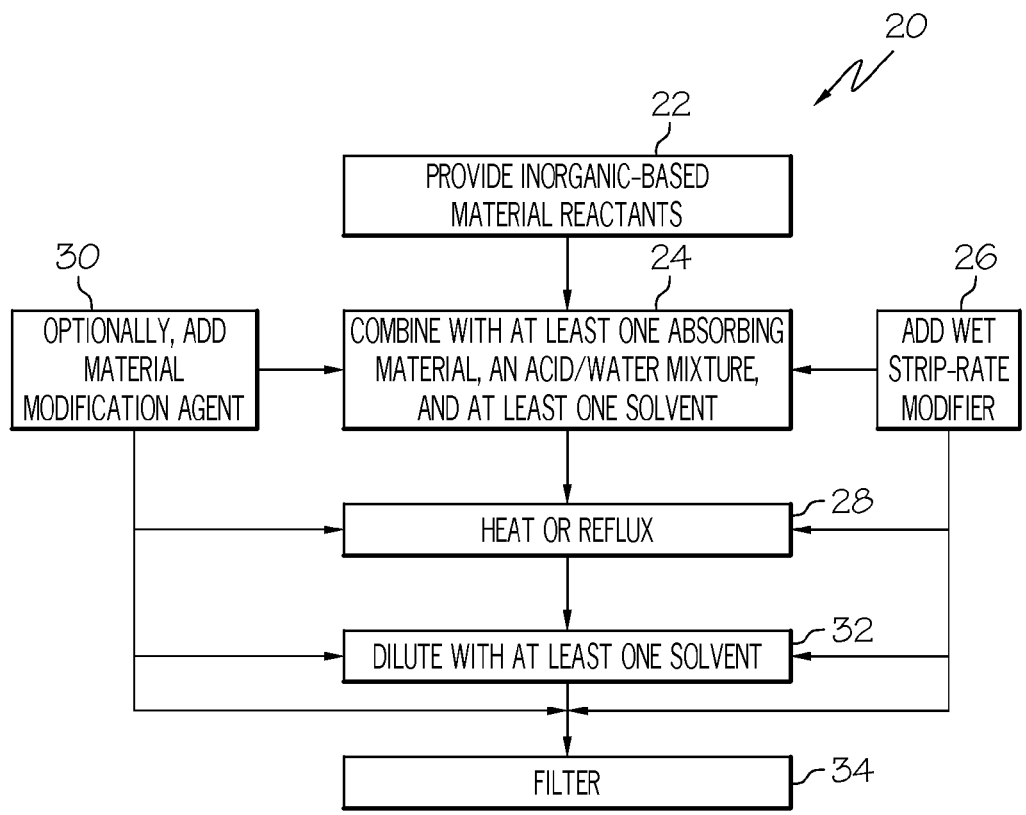
FIG. 2 is a flowchart of a method for fabricating a BARC composition in accordance with an exemplary embodiment of the present invention.

Referring to FIG. 2, one contemplated method 20 of making a BARC composition comprises providing the reactants of at least one inorganic-based material (step 22) and combining the reactants, at least one absorbing compound, an acid/water mixture, such as a nitric acid/water mixture, and at least one solvent to form a reaction mixture (step 24); and heating to a temperature about or above 40° C. or refluxing the reaction mixture to form a BARC composition solution (step 28). A wet strip-rate modifier combination also is added to the reaction mixture (step 26) before, during, or after the step of heating. If the wet strip-rate modifier combination comprise a dopant, it is preferable that the dopant donor is added during the step of combining with the inorganic-based material reactants so that the backbone of the resulting polymer comprises the dopant (step 24). A material modification agent, such as an adhesion promoter, a pH tuning agent, a densifying agent, a catalyst, a capping agent, other functional additive, or a combination thereof also may be added (step 30) during or after the step of combining or during or after the step of heating/refluxing. The BARC composition solution formed is then diluted with at least one solvent (step 32) and filtered (step 34) to provide BARC compositions that produce films of various thicknesses. In addition, any other functional additives also may be added during the heating/refluxing step or after the heating/refluxing step.

More specifically, siloxane formed from a reaction mixture including silane reactants, for example tetraethylorthosilicate (TEOS); or TEOS and methyltriethoxysilane (MTEOS); tetramethylorthosilicate (TMOS) and methyltrimethoxysilane (MTMOS); or, alternatively, tetrachlorosilane and methyltrichlorosilane; at least one suitable absorbing material, such as absorbing materials 1-42; a wet strip-rate modifier combination; a solvent or combination of solvents; and an acid/water mixture, is combined in a reaction vessel. Appropriate solvents include acetone, 2-propanol, and other simple alcohols, ketones and esters such as 1-propanol, methylisobutyl ketone (MIBK), propoxypropanol, glycol ether acetates such as PGMEA, and propyl acetate. The acid/water mixture is, for example nitric acid and water. Other protic acids or acid anhydrides, such as acetic acid, lactic acid, oxalic acid, formic acid, phosphoric acid, hydrochloric acid or acetic anhydride are alternatively used in the acid mixture. The resulting mixture is heated to a temperature about or above 40° C. or refluxed for approximately 1 to 24 hours to produce the BARC composition. As mentioned above, unlike other materials that may increase the wet strip rate of compositions, the contemplated wet strip-rate modifier combinations, upon heating, do not leave pores, voids, or defects in the resulting BARCs. Rather, the contemplated wet strip-rate modifier combinations do not adversely affect the resulting BARC's surface and, thus, they permit a smooth and planarized surface of the BARC to be formed. As mentioned earlier, one or more material modification agents and other functional additive, and/or a combination thereof may be added before, during or after the heating/refluxing step. Also, the acid concentration and/or strength and the water concentration in the acid/water mixture may be varied in order to become a pH tuning agent, depending on the resist material chosen for the specific layered material, electronic component, or semiconductor component application, or to meet molecular weight and molecular weight stability requirements.

The BARC composition can be diluted with appropriate solvents to achieve coating solutions that produce films of various thicknesses. Suitable dilutant solvents include acetone, 2-propanol, ethanol, butanol, methanol, propylacetate, ethyl lactate, PGMEA, propylene glycol propyl ether, referred to commercially as Propasol-P, and other glycols such as dipropylene glycol and tetrethylene glycol. Dilutant solvents with high boiling points such as ethyl lactate and propylene glycol propyl ether have been found beneficial. It is believed high boiling point solvents decrease the probability of formation of bubble film defects. Additional solvents useful in the invention include ethylene glycol dimethyl ether, alternatively termed glyme, anisole, dibutyl ether, dipropyl ether, PGMEA, and pentanol. Furthermore, several viscosity agents may be added to the coating solution to affect the viscosity of the BARC composition, such as BYK 410 and BYK 420, available from BYK of Germany. The BARC composition is typically between about 0.5 and 20% polymer by weight. Prior to use, the BARC composition is filtered by standard filtration techniques.

Applications

Figure 3:
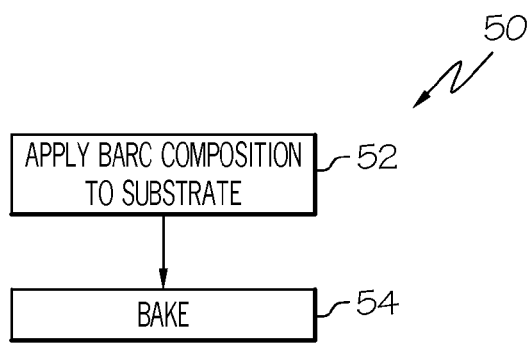
FIG. 3 is a flowchart of a method for fabricating a BARC overlying a substrate in accordance with an exemplary embodiment of the present invention.

The BARC compositions disclosed herein are used to from BARCs that exhibit increased wet strip rates while maintaining etch resistivity to photoresist developers, such as 2.35-2.5% aqueous TMAH solutions. FIG. 3 is a flowchart of a method 50 for fabricating such BARCs, which method includes applying a BARC composition to a substrate (step 52). Substrates contemplated herein may comprise any desirable substantially solid material. Particularly desirable substrate layers would comprise films, glass, ceramic, plastic, metal or coated metal, or composite material. In preferred embodiments, the substrate comprises a silicon or germanium arsenide die or wafer surface, a packaging surface such as found in a copper, silver, nickel or gold plated leadframe, a copper surface such as found in a circuit board or package interconnect trace ("copper" includes considerations of bare copper and its oxides), a via-wall or stiffener interface, a polymer-based packaging or board interface such as found in a polyimide-based flex package, lead or other metal alloy solder ball surface, glass, and polymers such as polyimide. In more preferred embodiments, the substrate comprises a material common in the integrated circuit (IC) industry, such as silicon dioxide ($SiO_2$), carbon-doped silicon oxide (SiOCH), fluorine-doped silicon oxide (SiOF), silicon nitride (SiN), silicon carbide (SiC), silicon carbon nitride (SiCN), silicon oxycarbide (SiOC), and silicon oxynitride (SiON), and/or a material common in the packaging and circuit board industries, such as silicon, copper, glass, and another polymer.

The BARC compositions may be applied to various substrates and/or surfaces to form sacrificial via fill layers, layered materials, layers used in semiconductor processing, or layers used in electronic components, depending on the specific fabrication process. Typical methods for application include conventional spin-on deposition techniques, spray coating, extrusion coating, vapor deposition or chemical vapor deposition. The spin-on techniques include a dispense spin, a thickness spin, and thermal bake steps, to produce an inorganic coating. Typical processes include a thickness spin of between 800 and 4000 rpm for about 20 seconds.

The applied BARC composition then is baked using at least one baking step (step 54). In one exemplary embodiment, baking is performed using one to three bake steps at temperatures between 80° C. and 300° C. for about one minute each. Preferably, the bake steps are performed at temperatures below 300° C. and, more preferably, below 250° C., as it has been found that lower bake temperatures results in higher strip rates of the resulting BARCs, although bake temperatures should not be so low that resistance to photoresist developers, such as 2.38-2.5% aqueous solutions of TMAH, or photoresist patterning is adversely affected. This is due to the fact that more of the wet strip-rate modifier combination remains in the BARC after baking at lower temperatures than remains after baking at higher temperatures and the fact that the organosiloxane polymer is less cross-linked at lower temperatures than at higher temperatures.

The contemplated BARC compositions and BARCs formed therefrom are useful in the fabrication of a variety of electronic devices, micro-electronic devices, particularly semiconductor integrated circuits and various layered materials for electronic and semiconductor components, including hardmask layers, dielectric layers, etch stop layers and buried etch stop layers. These BARC compositions and BARCs are quite compatible with other materials that might be used for layered materials and devices, such as adamantane-based compounds, diamantane-based compounds, silicon-core compounds, organic dielectrics, and nanoporous dielectrics.

The BARC compositions and BARCs formed therefrom may be used to become a part of, form part of or form an electronic component and/or semiconductor component. As used herein, the term "electronic component" means any device or part that can be used in a circuit to obtain some desired electrical action. Electronic components contemplated herein may be classified in many different ways, including classification into active components and passive components. Active components are electronic components capable of some dynamic function, such as amplification, oscillation, or signal control, which usually requires a power source for its operation. Examples are bipolar transistors, field-effect transistors, and integrated circuits. Passive components are electronic components that are static in operation, i.e., are ordinarily incapable of amplification or oscillation, and usually require no power for their characteristic operation. Examples are conventional resistors, conductors, capacitors, inductors, diodes, rectifiers and fuses. In addition, the BARC may be used as a component to a dual patterning process whereby, in conjunction with other materials that could include other BARC materials, a dual patterning process is realized. Dual patterning, in which two interleaved resist patterns are formed, in some cases separated by a plasma etch step, has been shown to be a manufacturable process to meet next generation pattern resolution requirements.

EXAMPLES

The following are examples of BARC compositions with varying wet strip rate modifier combinations. FIG. 4 is a table illustrating the wet strip rates of the various wet strip rate modifier combinations of the following examples. The examples are provided for illustration purposes only and are not meant to limit the various embodiments of the present invention in any way.

Example 1

Into a 1 L flask connected to a water condenser, 297 g of IPA was dispensed and stirred. About 149 g of acetone was then added and the mixture was stirred for 5 min. About 140 g TEOS, 19 g MTEOS and 52 g PTEOS were added under vigorous stirring. 5.6 g of a 0.1 M aqueous nitric acid solution and 67 g deionized water were then added to the mixture. The mixture was refluxed for 4 hours. After 4 hours, the mixture was cooled to 65° C. and 43.77 g of butanol was added. The mixture then was diluted with PGMEA using a 94 g PGMEA/ 100 g mixture ratio. APTEOS triflate salt was prepared by combining 4.89 g 20% triflic acid and 1.425 g APTEOS to form a salt solution comprising 22.6% APTEOS. 47 g of ethanol and 8500 ppm APTEOS-triflate salt were added to the diluted formulation and the formulation was filtered using a standard Meissneri® filter of 0.04 micron pore size. The filtered formulation was applied via spin coating at 1500 revolutions per minute (rpm) for 30 sec. onto a silicon wafer to achieve a film having a thickness of about 160 nm after baking serially on three bake plates at 150, 200 and 300° C., respectively, for 90 sec. per plate under a nitrogen ambient. The wet strip rate (WSR) of this film when exposed to a 10:1 solution of Baker CLK-888:30% $H_2O_2$ at 50° C. for 5 min. was about 0.4 nm/min. The WSR of the film when exposed to a 2.38% aqueous solution of TMAH (available from Tokyo Ohka Kogyo America, Inc. of Milipitas, Calif.) at room temperature (about 25° C.) for 1 min. was 0 nm/min.

Example 2

Into a 1 L flask connected to a water condenser, 297 g of IPA was dispensed and stirred. About 149 g of acetone was then added and the mixture was stirred for 5 min. About 140 g TEOS, 19 g MTEOS and 52 g PTEOS were added under vigorous stirring. 5.6 g of a 0.1 M aqueous nitric acid solution and 67 g deionized water were then added to the mixture. The mixture was refluxed for 4 hours. After 4 hours, the mixture was cooled to 65° C. and 43.77 g of butanol was added. The mixture then was diluted with PGMEA using a 94 g PGMEA/ 100 g mixture ratio. Next, 33 g of ethanol and 14 g n-propanol were added to the diluted formulation. APTEOS triflate salt was prepared by combining 4.89 g 20% triflic acid and 1.425 g APTEOS to form a salt solution comprising 22.6% APTEOS. About 8500 ppm APTEOS-triflate salt was added and the formulation was filtered using a standard Meissneri® filter of 0.04 micron pore size. The filtered formulation was applied via spin coating at 1500 rpm for 30 sec. onto a silicon wafer to achieve a film having a thickness of about 160 nm after baking serially on three bake plates at 150, 200 and 300° C., respectively, for 90 sec. per plate under a nitrogen ambient. The WSR of this film when exposed to a 10:1 solution of Baker CLK888:30% $H_2O_2$ at 50° C. for 5 min. was about 1 nm/min. The WSR of the film when exposed to a 2.38% aqueous solution of TMAH (available from Tokyo Ohka Kogyo America, Inc. of Milipitas, Calif.) at room temperature (about 25° C.) for 1 min. was 0 nm/min.

Example 3

Into a 1 L flask connected to a water condenser, 297 g of IPA was dispensed and stirred. About 149 g of acetone was then added and the mixture was stirred for 5 min. About 140 g TEOS, 19 g MTEOS and 52 g PTEOS were added under vigorous stirring. 5.6 g of a 0.1 M aqueous nitric acid solution and 67 g deionized water were then added to the mixture. The mixture was refluxed for 4 hours. After 4 hours, the mixture was cooled to 65° C. and 43.77 g of butanol was added. The mixture then was diluted with PGMEA using a 94 g PGMEA/100 g mixture ratio. Next, 33 g of ethanol, 14 g of n-propanol and 2.8 g of dipropylene glycol (DPG) (in a 2.8 g DPG/100 g mixture ratio) were added. APTEOS triflate salt was prepared by combining 4.89 g 20% triflic acid and 1.425 g APTEOS to form a salt solution comprising 22.6% APTEOS. About 8500 ppm APTEOS-triflate salt was added to the diluted formulation and the formulation was filtered using a standard Meissneri® filter of 0.04 micron pore size. The filtered formulation was applied via spin coating at 1500 rpm for 30 sec. onto a silicon wafer to achieve a film having a thickness of about 160 nm after baking serially on three bake plates at 150, 200 and 300° C., respectively, for 90 sec. per plate under a nitrogen ambient. The WSR of this film when exposed to a 10:1 solution of Baker CLK888:30% $H_2O_2$ at 50° C. for 5 min. was about 1.6 nm/min. The WSR of the film when exposed to a 2.38% aqueous solution of TMAH (available from Tokyo Ohka Kogyo America, Inc. of Milipitas, Calif.) at room temperature (about 25° C.) for 1 min. was 0 nm/min.

Example 4

Into a 1 L flask connected to a water condenser, 297 g of IPA was dispensed and stirred. About 149 g of acetone was then added and the mixture was stirred for 5 min. About 140 g TEOS, 19 g MTEOS and 52 g PTEOS were added under vigorous stirring. 5.6 g of a 0.1 M aqueous nitric acid solution and 67 g deionized water were then added to the mixture. The mixture was refluxed for 4 hours. After 4 hours, the mixture was cooled to 65° C. and 43.77 g of butanol was added. The mixture then was diluted with PGMEA using a 94 g PGMEA/100 g mixture ratio. Next, 33 g of ethanol, 14 g of n-propanol and 0.2 g of tetraethylene glycol (TEG) (in a 0.2 g TEG/100 g mixture ratio) were added. APTEOS triflate salt was prepared by combining 4.89 g 20% triflic acid and 1.425 g APTEOS to form a salt solution comprising 22.6% APTEOS. About 8500 ppm APTEOS-triflate salt was added to the diluted formulation and the formulation was filtered using a standard Meissneri® filter of 0.04 micron pore size. The filtered formulation was applied via spin coating at 1500 rpm for 30 sec. onto a silicon wafer to achieve a film having a thickness of about 160 nm after baking serially on three bake plates at 150, 200 and 300° C., respectively, for 90 sec. per plate under a nitrogen ambient. The WSR of this film when exposed to a 10:1 solution of Baker CLK888:30% $H_2O_2$ at 50° C. for 5 min. was about 3.8 nm/min. The WSR of the film when exposed to a 2.38% aqueous solution of TMAH (available from Tokyo Ohka Kogyo America, Inc. of Milipitas, Calif.) at room temperature (about 25° C.) for 1 min. was 0 nm/min.

Example 5

Into a 1 L flask connected to a water condenser, 297 g of IPA was dispensed and stirred. About 149 g of acetone was then added and the mixture was stirred for 5 min. About 140 g TEOS, 19 g MTEOS and 52 g PTEOS were added under vigorous stirring. 5.6 g of a 0.1 M aqueous nitric acid solution and 67 g deionized water were then added to the mixture. The mixture was refluxed for 4 hours. After 4 hours, the mixture was cooled to 65° C. and 43.77 g of butanol was added. The mixture then was diluted with PGMEA using a 94 g PGMEA/100 g mixture ratio. Next, 47 g of ethanol, 2.8 g DPG, and 0.2 g of TEG (in a 0.2 g TEG/100 g mixture ratio) were added. APTEOS triflate salt was prepared by combining 4.89 g 20% triflic acid and 1.425 g APTEOS to form a salt solution comprising 22.6% APTEOS. About 8500 ppm APTEOS-triflate salt was added to the diluted formulation and the formulation was filtered using a standard Meissneri® filter of 0.04 micron pore size. The filtered formulation was applied via spin coating at 1500 rpm for 30 sec. onto a silicon wafer to achieve a film having a thickness of about 160 nm after baking serially on three bake plates at 150, 200 and 300° C., respectively, for 90 sec. per plate under a nitrogen ambient. The WSR of this film when exposed to a 10:1 solution of Baker CLK888:30% $H_2O_2$ at 50° C. for 5 min. was about 4.8 nm/min. The WSR of the film when exposed to a 2.38% aqueous solution of TMAH (available from Tokyo Ohka Kogyo America, Inc. of Milipitas, Calif.) at room temperature (about 25° C.) for 1 min. was 0 nm/min.

Example 6

Into a 1 L flask connected to a water condenser, 297 g of IPA was dispensed and stirred. About 149 g of acetone was then added and the mixture was stirred for 5 min. About 140 g TEOS, 19 g MTEOS and 52 g PTEOS were added under vigorous stirring. 5.6 g of a 0.1 M aqueous nitric acid solution and 67 g deionized water were then added to the mixture. The mixture was refluxed for 4 hours. After 4 hours, the mixture was cooled to 65° C. and 43.77 g of butanol was added. The mixture then was diluted with PGMEA using a 94 g PGMEA/100 g mixture ratio. Next, 34 g of ethanol, 14 g n-propanol, 2.8 g DPG, and 0.2 g of TEG (in a 0.2 g TEG/100 g mixture ratio) were added. APTEOS triflate salt was prepared by combining 4.89 g 20% triflic acid and 1.425 g APTEOS to form a salt solution comprising 22.6% APTEOS. About 8500 ppm APTEOS-triflate salt was added to the diluted formulation and the formulation was filtered using a standard Meissneri® filter of 0.04 micron pore size. The filtered formulation was applied via spin coating at 1500 rpm for 30 sec. onto a silicon wafer to achieve a film having a thickness of about 160 nm after baking serially on three bake plates at 150, 200 and 300° C., respectively, for 90 sec. per plate under a nitrogen ambient. The WSR of this film when exposed to a 10:1 solution of Baker CLK888:30% $H_2O_2$ at 50° C. for 5 min. was about 7.4 nm/min. The WSR of the film when exposed to a 2.38% aqueous solution of TMAH (available from Tokyo Ohka Kogyo America, Inc. of Milipitas, Calif.) at room temperature (about 25° C.) for 1 min. was 0 nm/min.

Example 7

Into a 1 L flask connected to a water condenser, 297 g of IPA was dispensed and stirred. About 149 g of acetone was then added and the mixture was stirred for 5 min. About 140 g TEOS, 19 g MTEOS and 52 g PTEOS were added under vigorous stirring. 5.6 g of a 0.1 M aqueous nitric acid solution and 67 g deionized water were then added to the mixture. The mixture was refluxed for 4 hours. After 4 hours, the mixture was cooled to 65° C. and 43.77 g of butanol was added. The mixture then was diluted with PGMEA using a 94 g PGMEA/100 g mixture ratio. Next, 34 g of ethanol, 20 g n-propanol, 2.8 g DPG, and 0.2 g of TEG (in a 0.2 g TEG/100 g mixture ratio) were added. APTEOS triflate salt was prepared by combining 4.89 g 20% triflic acid and 1.425 g APTEOS to form a salt solution comprising 22.6% APTEOS. About 8500 ppm APTEOS-triflate salt was added to the diluted formulation and the formulation was filtered using a standard Meissneri® filter of 0.04 micron pore size. The filtered formulation was applied via spin coating at 1500 rpm for 30 sec. onto a silicon wafer to achieve a film having a thickness of about 160 nm after baking serially on three bake plates at 150, 200 and 300° C., respectively, for 90 sec. per plate under a nitrogen ambient. The WSR of this film when exposed to a 10:1 solution of Baker CLK888:30% $H_2O_2$ at 50° C. for 5 min. was about 7.3 nm/min. The WSR of the film when exposed to a 2.38% aqueous solution of TMAH (available from Tokyo Ohka Kogyo America, Inc. of Milipitas, Calif.) at room temperature (about 25° C.) for 1 min. was 0 nm/min.

Example 8

Into a 1 L flask connected to a water condenser, 297 g of IPA was dispensed and stirred. About 149 g of acetone was then added and the mixture was stirred for 5 min. About 140 g TEOS, 19 g MTEOS and 52 g PTEOS were added under vigorous stirring. 5.6 g of a 0.1 M aqueous nitric acid solution and 67 g deionized water were then added to the mixture. The mixture was refluxed for 4 hours. After 4 hours, the mixture was cooled to 65° C. and 43.77 g of butanol was added. The mixture then was diluted with PGMEA using a 94 g PGMEA/100 g mixture ratio. Next, 34 g of ethanol, 28 g n-propanol, 2.8 g DPG, and 0.2 g of TEG (in a 0.2 g TEG/100 g mixture ratio) were added. APTEOS triflate salt was prepared by combining 4.89 g 20% triflic acid and 1.425 g APTEOS to form a salt solution comprising 22.6% APTEOS. About 8500 ppm APTEOS-triflate salt was added to the diluted formulation and the formulation was filtered using a standard Meissneri® filter of 0.04 micron pore size. The filtered formulation was applied via spin coating at 1500 rpm for 30 sec. onto a silicon wafer to achieve a film having a thickness of about 160 nm after baking serially on three bake plates at 150, 200 and 300° C., respectively, for 90 sec. per plate under a nitrogen ambient. The WSR of this film when exposed to a 10:1 solution of Baker CLK888:30% $H_2O_2$ at 50° C. for 5 min. was about 8.3 nm/min. The WSR of the film when exposed to a 2.38% aqueous solution of TMAH (available from Tokyo Ohka Kogyo America, Inc. of Milipitas, Calif.) at room temperature (about 25° C.) for 1 min. was 0 nm/min.

Example 9

Into a 1 L flask connected to a water condenser, 297 g of IPA was dispensed and stirred. About 149 g of acetone was then added and the mixture was stirred for 5 min. About 140 g TEOS, 19 g MTEOS and 52 g PTEOS were added under vigorous stirring. 5.6 g of a 0.1 M aqueous nitric acid solution and 67 g deionized water were then added to the mixture. The mixture was refluxed for 4 hours. After 4 hours, the mixture was cooled to 65° C. and 43.77 g of butanol was added. The mixture then was diluted with PGMEA using a 94 g PGMEA/100 g mixture ratio. Next, 34 g of ethanol, 14 g n-propanol, 5 g DPG, and 0.2 g of TEG (in a 0.2 g TEG/100 g mixture ratio) were added. APTEOS triflate salt was prepared by combining 4.89 g 20% triflic acid and 1.425 g APTEOS to form a salt solution comprising 22.6% APTEOS. About 8500 ppm APTEOS-triflate salt was added to the diluted formulation and the formulation was filtered using a standard Meissneri® filter of 0.04 micron pore size. The filtered formulation was applied via spin coating at 1500 rpm for 30 sec. onto a silicon wafer to achieve a film having a thickness of about 160 nm after baking serially on three bake plates at 150, 200 and 300° C., respectively, for 90 sec. per plate under a nitrogen ambient. The WSR of this film when exposed to a 10:1 solution of Baker CLK888:30% $H_2O_2$ at 50° C. for 5 min. was about 7.6 nm/min. The WSR of the film when exposed to a 2.38% aqueous solution of TMAH (available from Tokyo Ohka Kogyo America, Inc. of Milipitas, Calif.) at room temperature (about 25° C.) for 1 min. was 0 nm/min.

Example 10

Into a 1 L flask connected to a water condenser, 297 g of IPA was dispensed and stirred. About 149 g of acetone was then added and the mixture was stirred for 5 min. About 140 g TEOS, 19 g MTEOS and 52 g PTEOS were added under vigorous stirring. 5.6 g of a 0.1 M aqueous nitric acid solution and 67 g deionized water were then added to the mixture. The mixture was refluxed for 4 hours. After 4 hours, the mixture was cooled to 65° C. and 43.77 g of butanol was added. The mixture then was diluted with PGMEA using a 94 g PGMEA/100 g mixture ratio. Next, 34 g of ethanol, 14 g n-propanol, 5 g DPG, and 0.5 g of TEG (in a 0.2 g TEG/100 g mixture ratio) were added. APTEOS triflate salt was prepared by combining 4.89 g 20% triflic acid and 1.425 g APTEOS to form a salt solution comprising 22.6% APTEOS. About 8500 ppm APTEOS-triflate salt was added to the diluted formulation and the formulation was filtered using a standard Meissneri® filter of 0.04 micron pore size. The filtered formulation was applied via spin coating at 1500 rpm for 30 sec. onto a silicon wafer to achieve a film having a thickness of about 160 nm after baking serially on three bake plates at 150, 200 and 300° C., respectively, for 90 sec. per plate under a nitrogen ambient. The WSR of this film when exposed to a 10:1 solution of Baker CLK888:30% $H_2O_2$ at 50° C. for 5 min. was about 14.6 nm/min. The WSR of the film when exposed to a 2.38% aqueous solution of TMAH (available from Tokyo Ohka Kogyo America, Inc. of Milipitas, Calif.) at room temperature (about 25° C.) for 1 min. was 0 nm/min.

Example 11

Into a 1 L flask connected to a water condenser, 297 g of IPA was dispensed and stirred. About 149 g of acetone was then added and the mixture was stirred for 5 min. About 140 g TEOS, 19 g MTEOS and 52 g PTEOS were added under vigorous stirring. 5.6 g of a 0.1 M aqueous nitric acid solution and 67 g deionized water were then added to the mixture. The mixture was refluxed for 4 hours. After 4 hours, the mixture was cooled to 65° C. and 43.77 g of butanol was added. The mixture then was diluted with PGMEA using a 94 g PGMEA/100 g mixture ratio. Next, 34 g of ethanol, 14 g n-propanol, 5 g DPG, and 1.5 g of TEG (in a 0.2 g TEG/100 g mixture ratio) were added. APTEOS triflate salt was prepared by combining 4.89 g 20% triflic acid and 1.425 g APTEOS to form a salt solution comprising 22.6% APTEOS. About 8500 ppm APTEOS-triflate salt was added to the diluted formulation and the formulation was filtered using a standard Meissneri® filter of 0.04 micron pore size. The filtered formulation was applied via spin coating at 1500 rpm for 30 sec. onto a silicon wafer to achieve a film having a thickness of about 160 nm after baking serially on three bake plates at 150, 200 and 300° C., respectively, for 90 sec. per plate under a nitrogen ambient. The WSR of this film when exposed to a 10:1 solution of Baker CLK888:30% $H_2O_2$ at 50° C. for 5 min. was about 34.6 nm/min. The WSR of the film when exposed to a 2.38% aqueous solution of TMAH (available from Tokyo Ohka Kogyo America, Inc. of Milipitas, Calif.) at room temperature (about 25° C.) for 1 min. was 0 nm/min.

Example 12

Into a 1 L flask connected to a water condenser, 297 g of IPA was dispensed and stirred. About 149 g of acetone was then added and the mixture was stirred for 5 min. About 140 g TEOS, 19 g MTEOS and 52 g PTEOS were added under vigorous stirring. 5.6 g of a 0.1 M aqueous nitric acid solution and 67 g deionized water were then added to the mixture. The mixture was refluxed for 4 hours. After 4 hours, the mixture was cooled to 65° C. and 43.77 g of butanol was added. The mixture then was diluted with PGMEA using a 94 g PGMEA/100 g mixture ratio. Next, 34 g of ethanol, 14 g n-propanol, 5 g DPG, and 3.5 g of TEG (in a 0.2 g TEG/100 g mixture ratio) were added. APTEOS triflate salt was prepared by combining 4.89 g 20% triflic acid and 1.425 g APTEOS to form a salt solution comprising 22.6% APTEOS. About 8500 ppm APTEOS-triflate salt was added to the diluted formulation and the formulation was filtered using a standard Meissneri® filter of 0.04 micron pore size. The filtered formulation was applied via spin coating at 1500 rpm for 30 sec. onto a silicon wafer to achieve a film having a thickness of about 160 nm after baking serially on three bake plates at 150, 200 and 300° C., respectively, for 90 sec. per plate under a nitrogen ambient. The WSR of this film when exposed to a 10:1 solution of Baker CLK888:30% $H_2O_2$ at 50° C. for 5 min. was about 45 nm/min. The WSR of the film when exposed to a 2.38% aqueous solution of TMAH (available from Tokyo Ohka Kogyo America, Inc. of Milipitas, Calif.) at room temperature (about 25° C.) for 1 min. was 0 nm/min.

Example 13

Into a 1 L flask connected to a water condenser, 297 g of IPA was dispensed and stirred. About 149 g of acetone was then added and the mixture was stirred for 5 min. About 140 g TEOS, 19 g MTEOS and 52 g PTEOS were added under vigorous stirring. 5.6 g of a 0.1 M aqueous nitric acid solution and 67 g deionized water were then added to the mixture. The mixture was refluxed for 4 hours. After 4 hours, the mixture was cooled to 65° C. and 43.77 g of butanol was added. The mixture then was diluted with PGMEA using a 94 g PGMEA/100 g mixture ratio. Next, 34 g of ethanol, 14 g methanol, 2.8 g DPG, and 0.2 g of TEG (in a 0.2 g TEG/100 g mixture ratio) were added. APTEOS triflate salt was prepared by combining 4.89 g 20% triflic acid and 1.425 g APTEOS to form a salt solution comprising 22.6% APTEOS. About 8500 ppm APTEOS-triflate salt was added to the diluted formulation and the formulation was filtered using a standard Meissneri® filter of 0.04 micron pore size. The filtered formulation was applied via spin coating at 1500 rpm for 30 sec. onto a silicon wafer to achieve a film having a thickness of about 160 nm after baking serially on three bake plates at 150, 200 and 300° C., respectively, for 90 sec. per plate under a nitrogen ambient. The WSR of this film when exposed to a 10:1 solution of Baker CLK888:30% $H_2O_2$ at 50° C. for 5 min. was about 5.1 nm/min. The WSR of the film when exposed to a 2.38% aqueous solution of TMAH (available from Tokyo Ohka Kogyo America, Inc. of Milipitas, Calif.) at room temperature (about 25° C.) for 1 min. was 0 nm/min.

Example 14

Into a 1 L flask connected to a water condenser, 297 g of IPA was dispensed and stirred. About 149 g of acetone was then added and the mixture was stirred for 5 min. About 140 g TEOS, 19 g MTEOS and 52 g PTEOS were added under vigorous stirring. 5.6 g of a 0.1 M aqueous nitric acid solution and 67 g deionized water were then added to the mixture. The mixture was refluxed for 4 hours. After 4 hours, the mixture was cooled to 65° C. and 43.77 g of butanol was added. The mixture then was diluted with PGMEA using a 94 g PGMEA/100 g mixture ratio. Next, 34 g of ethanol, 14 g butanol, 2.8 g DPG, and 0.2 g of TEG (in a 0.2 g TEG/100 g mixture ratio) were added. APTEOS triflate salt was prepared by combining 4.89 g 20% triflic acid and 1.425 g APTEOS to form a salt solution comprising 22.6% APTEOS. About 8500 ppm APTEOS-triflate salt was added to the diluted formulation and the formulation was filtered using a standard Meissneri® filter of 0.04 micron pore size. The filtered formulation was applied via spin coating at 1500 rpm for 30 sec. onto a silicon wafer to achieve a film having a thickness of about 160 nm after baking serially on three bake plates at 150, 200 and 300° C., respectively, for 90 sec. per plate under a nitrogen ambient. The WSR of this film when exposed to a 10:1 solution of Baker CLK888:30% $H_2O_2$ at 50° C. for 5 min. was about 4.1 nm/min. The WSR of the film when exposed to a 2.38% aqueous solution of TMAH (available from Tokyo Ohka Kogyo America, Inc. of Milipitas, Calif.) at room temperature (about 25° C.) for 1 min. was 0 nm/min.

Example 15

Into a 1 L flask connected to a water condenser, 297 g of IPA was dispensed and stirred. About 149 g of acetone was then added and the mixture was stirred for 5 min. About 140 g TEOS, 19 g MTEOS and 52 g PTEOS were added under vigorous stirring. 5.6 g of a 0.1 M aqueous nitric acid solution and 67 g deionized water were then added to the mixture. The mixture was refluxed for 4 hours. After 4 hours, the mixture was cooled to 65° C. and 43.77 g of butanol was added. The mixture then was diluted with PGMEA using a 94 g PGMEA/100 g mixture ratio. Next, 34 g of ethanol, 14 g pentanol, 2.8 g DPG, and 0.2 g of TEG (in a 0.2 g TEG/100 g mixture ratio) were added. APTEOS triflate salt was prepared by combining 4.89 g 20% triflic acid and 1.425 g APTEOS to form a salt solution comprising 22.6% APTEOS. About 8500 ppm APTEOS-triflate salt was added to the diluted formulation and the formulation was filtered using a standard Meissneri® filter of 0.04 micron pore size. The filtered formulation was applied via spin coating at 1500 rpm for 30 sec. onto a silicon wafer to achieve a film having a thickness of about 160 nm after baking serially on three bake plates at 150, 200 and 300° C., respectively, for 90 sec. per plate under a nitrogen ambient. The WSR of this film when exposed to a 10:1 solution of Baker CLK888:30% $H_2O_2$ at 50° C. for 5 min. was about 4.4 nm/min. The WSR of the film when exposed to a 2.38% aqueous solution of TMAH (available from Tokyo Ohka Kogyo America, Inc. of Milipitas, Calif.) at room temperature (about 25° C.) for 1 min. was 0 nm/min.

Example 16

Into a 1 L flask connected to a water condenser, 297 g of IPA was dispensed and stirred. About 149 g of acetone was then added and the mixture was stirred for 5 min. About 140 g TEOS, 19 g MTEOS and 52 g PTEOS were added under vigorous stirring. 5.6 g of a 0.1 M aqueous nitric acid solution and 67 g deionized water were then added to the mixture. The mixture was refluxed for 4 hours. After 4 hours, the mixture was cooled to 65° C. and 43.77 g of butanol was added. The mixture then was diluted with PGMEA using a 94 g PGMEA/100 g mixture ratio. APTEOS triflate salt was prepared by combining 4.89 g 20% triflic acid and 1.425 g APTEOS to form a salt solution comprising 22.6% APTEOS. Next, 47 g of ethanol, 8500 ppm APTEOS-triflate salt, and 1 g of a 10 ppm phosphorous solution were added and the formulation was filtered using a standard Meissneri® filter of 0.04 micron pore size. The filtered formulation was applied via spin coating at 1500 rpm for 30 sec. onto a silicon wafer to achieve a film having a thickness of about 160 nm after baking serially on three bake plates at 150, 200 and 300° C., respectively, for 90 sec. per plate under a nitrogen ambient. The WSR of this film when exposed to a 10:1 solution of Baker CLK888:30% $H_2O_2$ at 50° C. for 5 min. was about 0.7 nm/min. The WSR of the film when exposed to a 2.38% aqueous solution of TMAH (available from Tokyo Ohka Kogyo America, Inc. of Milipitas, Calif.) at room temperature (about 25° C.) for 1 min. was 0 nm/min.

Example 17

Into a 1 L flask connected to a water condenser, 297 g of IPA was dispensed and stirred. About 149 g of acetone was then added and the mixture was stirred for 5 min. About 140 g TEOS, 19 g MTEOS and 52 g PTEOS were added under vigorous stirring. 5.6 g of a 0.1 M aqueous nitric acid solution and 67 g deionized water were then added to the mixture. The mixture was refluxed for 4 hours. After 4 hours, the mixture was cooled to 65° C. and 43.77 g of butanol was added. The mixture then was diluted with PGMEA using a 94 g PGMEA/100 g mixture ratio. APTEOS triflate salt was prepared by combining 4.89 g 20% triflic acid and 1.425 g APTEOS to form a salt solution comprising 22.6% APTEOS. Next, 47 g of ethanol, 8500 ppm APTEOS-triflate salt, and 1 g of a 10 ppm boron solution were added and the formulation was filtered using a standard Meissneri® filter of 0.04 micron pore size. The filtered formulation was applied via spin coating at 1500 rpm for 30 sec. onto a silicon wafer to achieve a film having a thickness of about 160 nm after baking serially on three bake plates at 150, 200 and 300° C., respectively, for 90 sec. per plate under a nitrogen ambient. The WSR of this film when exposed to a 10:1 solution of Baker CLK888:30% $H_2O_2$ at 50° C. for 5 min. was about 1.6 nm/min. The WSR of the film when exposed to a 2.38% aqueous solution of TMAH (available from Tokyo Ohka Kogyo America, Inc. of Milipitas, Calif.) at room temperature (about 25° C.) for 1 min. was 0 nm/min.

Example 18

Into a 1 L flask connected to a water condenser, 297 g of IPA was dispensed and stirred. About 149 g of acetone was then added and the mixture was stirred for 5 min. About 140 g TEOS, 19 g MTEOS and 52 g PTEOS were added under vigorous stirring. 5.6 g of a 0.1 M aqueous nitric acid solution and 67 g deionized water were then added to the mixture. The mixture was refluxed for 4 hours. After 4 hours, the mixture was cooled to 65° C. and 43.77 g of butanol was added. The mixture then was diluted with PGMEA using a 94 g PGMEA/100 g mixture ratio. Next, 34 g of ethanol, 14 g n-propanol, 5 g DPG, and 5.5 g of TEG (in a 0.2 g TEG/100 g mixture ratio) were added. APTEOS triflate salt was prepared by combining 4.89 g 20% triflic acid and 1.425 g APTEOS to form a salt solution comprising 22.6% APTEOS. About 8500 ppm APTEOS-triflate salt was added to the diluted formulation and the formulation was filtered using a standard Meissneri® filter of 0.04 micron pore size. The filtered formulation was applied via spin coating at 1500 rpm for 30 sec. onto a silicon wafer to achieve a film having a thickness of about 160 nm after baking serially on three bake plates at 150, 200 and 300° C., respectively, for 90 sec. per plate under a nitrogen ambient. The WSR of this film when exposed to a 10:1 solution of CLK888:30% $H_2O_2$ at 50° C. for 5 min. was about 45 nm/min. The WSR of the film when exposed to a 2.38% aqueous solution of TMAH (available from Tokyo Ohka Kogyo America, Inc. of Milipitas, Calif.) at room temperature (about 25° C.) for 1 min. was 7.2 nm/min.

Example 19

Into a 1 L flask connected to a water condenser, 297 g of IPA was dispensed and stirred. About 149 g of acetone was then added and the mixture was stirred for 5 min. About 140 g TEOS, 19 g MTEOS and 52 g PTEOS were added under vigorous stirring. 5.6 g of a 0.1 M aqueous nitric acid solution and 67 g deionized water were then added to the mixture. The mixture was refluxed for 4 hours. After 4 hours, the mixture was cooled to 65° C. and 43.77 g of butanol was added. The mixture then was diluted with PGMEA using a 94 g PGMEA/100 g mixture ratio. Next, 34 g of ethanol, 14 g n-propanol, and 5.5 g of TEG (in a 0.2 g TEG/100 g mixture ratio) were added. APTEOS triflate salt was prepared by combining 4.89 g 20% triflic acid and 1.425 g APTEOS to form a salt solution comprising 22.6% APTEOS. About 8500 ppm APTEOS-triflate salt was added to the diluted formulation and the formulation was filtered using a standard Meissneri® filter of 0.04 micron pore size. The filtered formulation was applied via spin coating at 1500 rpm for 30 sec. onto a silicon wafer to achieve a film having a thickness of about 160 nm after baking serially on three bake plates at 150, 200 and 300° C., respectively, for 90 sec. per plate under a nitrogen ambient. The WSR of this film when exposed to a 10:1 solution of Baker CLK888:30% $H_2O_2$ at 50° C. for 5 min. was about 45 nm/min. The WSR of the film when exposed to a 2.38% aqueous solution of TMAH (available from Tokyo Ohka Kogyo America, Inc. of Milipitas, Calif.) at room temperature (about 25° C.) for 1 min. was 35.2 nm/min.

Example 20

Into a 1 L flask connected to a water condenser, 297 g of IPA was dispensed and stirred. About 149 g of acetone was then added and the mixture was stirred for 5 min. About 140 g TEOS, 19 g MTEOS and 52 g PTEOS were added under vigorous stirring. 5.6 g of a 0.1 M aqueous nitric acid solution and 67 g deionized water were then added to the mixture. The mixture was refluxed for 4 hours. After 4 hours, the mixture was cooled to 65° C. and 43.77 g of butanol was added. The mixture then was diluted with PGMEA using a 94 g PGMEA/100 g mixture ratio. Next, 34 g of ethanol, 14 g n-propanol, 2.8 g DPG, and 0.2 g of TEG (in a 0.2 g TEG/100 g mixture ratio) were added. APTEOS triflate salt was prepared by combining 4.89 g 20% triflic acid and 1.425 g APTEOS to form a salt solution comprising 22.6% APTEOS. About 8500 ppm APTEOS-triflate salt was added to the diluted formulation and the formulation was filtered using a standard Meissneri® filter of 0.04 micron pore size. The formulation then was kept at 40° C. for 7 days to assess the effect of aging on the wet strip rate. The aged formulation was applied via spin coating at 1500 rpm for 30 sec. onto a silicon wafer to achieve a film having a thickness of about 160 nm after baking serially on three bake plates at 150, 200 and 300° C., respectively, for 90 sec. per plate under a nitrogen ambient. The WSR of this film when exposed to a 10:1 solution of Baker CLK888:30% $H_2O_2$ at 50° C. for 5 min. was about 7.6 nm/min. The WSR of the film when exposed to a 2.38% aqueous solution of TMAH (available from Tokyo Ohka Kogyo America, Inc. of Milipitas, Calif.) at room temperature (about 25° C.) for 1 min. was 0 nm/min. Accordingly, aging of the formulation did not appear to affect its wet strip rate.

Example 21

Into a 1 L flask connected to a water condenser, 297 g of IPA was dispensed and stirred. About 149 g of acetone was then added and the mixture was stirred for 5 min. About 140 g TEOS, 19 g MTEOS and 52 g PTEOS were added under vigorous stirring. 5.6 g of a 0.1 M aqueous nitric acid solution and 67 g deionized water were then added to the mixture. The mixture was refluxed for 4 hours. After 4 hours, the mixture was cooled to 65° C. and 43.77 g of butanol was added. The mixture then was diluted with PGMEA using a 94 g PGMEA/100 g mixture ratio. Next, 34 g ethanol, 14 g n-propanol, 2.8 g DPG, and 0.2 g TEG (in a 0.2 g TEG/100 g mixture ratio) were added. APTEOS triflate salt was prepared by combining 4.89 g 20% triflic acid and 1.425 g APTEOS to form a salt solution comprising 22.6% APTEOS. About 8500 ppm APTEOS-triflate salt was added to the diluted formulation and the formulation was filtered through a 0.02 micron CUNO® filter, available from Cuno Inc., of Meriden, Conn. The filtered formulation was applied via spin coating at 1500 rpm for 30 sec. onto a silicon wafer to achieve a film having a thickness of about 160 nm after baking serially on three bake plates at 150, 200 and 300° C., respectively, for 90 sec. per plate under a nitrogen ambient. The WSR of this film when exposed to a 10:1 solution of Baker CLK888:30% $H_2O_2$ at 50° C for 5 min. was about 7.6 nm/min. The WSR of the film when exposed to a 2.38% aqueous solution of TMAH (available from Tokyo Ohka Kogyo America, Inc. of Milipitas, Calif.) at room temperature (about 25° C.) for 1 min. was 0 nm/min. Accordingly, filtering the formulation with a filter having a lower pore size does not appear to affect the wet strip rate.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. A bottom antireflective coating (BARC) composition comprising:
   a silicon-comprising material;
   an absorbing material that absorbs light in the ultraviolet range; and
   a wet strip-rate modifier combination comprising a combination of dipropylene glycol (DPG) and tetraethylene glycol (TEG).

2. The BARC composition of claim 1, wherein the wet strip-rate modifier combination further comprises n-propanol.

3. The BARC composition of claim 1, wherein the wet strip-rate modifier combination further comprises ethanol.

4. The BARC composition of claim 1, wherein the wet strip-rate modifier combination comprises from about 1 to about 15 wt. % of the BARC composition of DPG.

5. The BARC composition of claim 1, wherein the wet strip-rate modifier combination comprises from about 0.05 to about 10 wt. % of the BARC composition of TEG.

6. The BARC composition of claim 1, wherein the wet strip-rate modifier combination further comprises a dopant.

7. The BARC composition of claim 6, wherein the dopant is phosphorous, boron, or a combination thereof.

8. The BARC composition of claim 1, wherein the BARC composition further comprises a material modification agent selected from the group consisting of an adhesion promoter, a pH tuning agent, a catalyst, a cross-linking agent, a high-boiling point solvent, a capping agent, and a combination thereof.

9. The BARC composition of claim 1, wherein the silicon-comprising material is a siloxane, a silsesquioxane, a silicate, a silazane, or a combination thereof.

10. A bottom antireflective coating (BARC) comprising:
    a siloxane, a silsesquioxane, a silicate, a silazane, or a combination thereof;
    an absorbing material that absorbs light in the ultraviolet range;
    dipropylene glycol (DPG) and tetraethylene glycol (TEG), or the combination of dipropylene glycol (DPG) and tetraethylene glycol (TEG), or the combination of a short chain linear alcohol, and tetraethylene glycol (TEG) wherein the short chain linear alcohol is selected from a group consisting of ethanol, n-propanol and combinations thereof; and
    a dopant selected from the group consisting of phosphorous, boron, and a combination thereof.

* * * * *